US011610924B2

(12) United States Patent
Dofuku

(10) Patent No.: US 11,610,924 B2
(45) Date of Patent: Mar. 21, 2023

(54) SOLID-STATE IMAGING DEVICE CAPABLE OF INHIBITING PEELING OF FIXED CHARGE FILM, METHOD OF MANUFACTURING THE SAME, AND ELECTRONIC DEVICE

(71) Applicant: SONY CORPORATION, Tokyo (JP)

(72) Inventor: Tadayuki Dofuku, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 149 days.

(21) Appl. No.: 17/108,579

(22) Filed: Dec. 1, 2020

(65) Prior Publication Data

US 2021/0082984 A1 Mar. 18, 2021

Related U.S. Application Data

(63) Continuation of application No. 16/573,516, filed on Sep. 17, 2019, now Pat. No. 10,879,287, which is a
(Continued)

(30) Foreign Application Priority Data

Nov. 18, 2014 (JP) .................................. 2014-233312

(51) Int. Cl.
*H01L 31/0203* (2014.01)
*H01L 27/146* (2006.01)
(Continued)

(52) U.S. Cl.
CPC ........ *H01L 27/14623* (2013.01); *H01L 21/76* (2013.01); *H01L 27/14* (2013.01);
(Continued)

(58) Field of Classification Search
CPC ........... H01L 27/14623; H01L 27/1463; H01L 27/1464; H01L 27/14689
(Continued)

(56) References Cited

U.S. PATENT DOCUMENTS 10,453,884 B2 10/2019 Dofuku
10,879,287 B2 12/2020 Dofuku
(Continued)

FOREIGN PATENT DOCUMENTS

| JP | 2009-182223 | 8/2009 |
| JP | 2014-033107 | 2/2014 |
| WO | WO 2014/002826 | 1/2014 |

OTHER PUBLICATIONS

International Search Report and Written Opinion for International (PCT) Patent Application No. PCT/JP2015/081269, dated Jan. 26, 2016, 10 pages.
(Continued)

*Primary Examiner* — Phuc T Dang
(74) *Attorney, Agent, or Firm* — Sheridan Ross P.C.

(57) ABSTRACT

The present technology relates to a solid-state imaging device capable of inhibiting peeling of a fixed charge film while inhibiting dark current, a method of manufacturing the same, and an electronic device. A solid-state imaging device provided with a semiconductor substrate in which a plurality of photodiodes is formed, a groove portion formed in a depth direction from a light incident side for forming an element separating unit between adjacent photoelectric conversion elements on the semiconductor substrate, a first fixed charge film formed so as to cover a surface of a planar portion on the light incident side of the semiconductor substrate, and a second fixed charge film formed so as to cover an inner wall surface of the groove portion formed on the semiconductor substrate is provided. The present technology is applicable to a backside illumination CMOS image sensor, for example.

17 Claims, 16 Drawing Sheets

Related U.S. Application Data continuation of application No. 15/519,915, filed as application No. PCT/JP2015/081269 on Nov. 6, 2015, now Pat. No. 10,453,884.

(51) Int. Cl.
*H01L 21/76* (2006.01)
*H01L 27/14* (2006.01)

(52) U.S. Cl.
CPC ........ *H01L 27/146* (2013.01); *H01L 27/1463* (2013.01); *H01L 27/1464* (2013.01); *H01L 27/14689* (2013.01)

(58) Field of Classification Search
USPC ........................................................ 257/432
See application file for complete search history.

(56) References Cited

U.S. PATENT DOCUMENTS

| | | | |
|---|---|---|---|
| 2011/0175187 A1 | 7/2011 | Ueno et al. | |
| 2011/0176023 A1* | 7/2011 | Jung | H01L 27/14643 257/E31.127 |
| 2012/0025059 A1 | 2/2012 | Kawashima et al. | |
| 2012/0217601 A1 | 8/2012 | Miyanami | |
| 2013/0020468 A1* | 1/2013 | Mitsuhashi | H01L 27/14634 257/E21.585 |
| 2014/0048897 A1 | 2/2014 | Qian et al. | |
| 2014/0054662 A1* | 2/2014 | Yanagita | H01L 27/14685 438/73 |
| 2015/0221692 A1 | 8/2015 | Enomoto et al. | |
| 2015/0325606 A1 | 11/2015 | Togashi et al. | |

OTHER PUBLICATIONS

Official Action for U.S. Appl. No. 15/519,915, dated Sep. 24, 2018, 10 pages.
Official Action for U.S. Appl. No. 15/519,915, dated Feb. 11, 2019, 9 pages.
Notice of Allowance for U.S. Appl. No. 15/519,915, dated Jun. 6, 2019, 10 pages.
Official Action for U.S. Appl. No. 16/573,516, dated Jan. 30, 2020, 9 pages.
Official Action for U.S. Appl. No. 16/573,516, dated Jun. 17, 2020, 9 pages.
Notice of Allowance for U.S. Appl. No. 16/573,516, dated Aug. 31, 2020, 8 pages.

* cited by examiner

SOLID-STATE IMAGING DEVICE CAPABLE OF INHIBITING PEELING OF FIXED CHARGE FILM, METHOD OF MANUFACTURING THE SAME, AND ELECTRONIC DEVICE

CROSS REFERENCE TO RELATED APPLICATIONS

This application is a continuation of U.S. patent application Ser. No. 16/573,516 filed Sep. 17, 2019, which is a continuation of U.S. patent application Ser. No. 15/519,915, filed Apr. 18, 2017, now U.S. Pat. No. 10,453,884, which is a national stage application under 35 U.S.C. 371 and claims the benefit of PCT Application No. PCT/JP2015/081269 having an international filing date of Nov. 6, 2015, which designated the United States, which PCT application claimed the benefit of Japanese Patent Application No. 2014-233312 filed Nov. 18, 2014, the disclosures of which are incorporated herein by reference in their entirety.

TECHNICAL FIELD

The present technology relates to a solid-state imaging device, a method of manufacturing the same, and an electronic device, and especially relates to the solid-state imaging device capable of inhibiting peeling of a fixed charge film while inhibiting dark current, the method of manufacturing the same, and the electronic device.

BACKGROUND ART

Recently, a backside illumination solid-state imaging device in which light is applied from a side opposite to a side on which a wiring layer is formed on a semiconductor substrate is suggested (for example, refer to Patent Document 1). In the solid-state imaging device disclosed in Patent Document 1, an element separating unit for electrically separating pixels is formed on a boundary of adjacent pixels formed on the semiconductor substrate.

CITATION LIST

Patent Document

Patent Document 1: Japanese Patent Application Laid-Open No. 2012-191005

SUMMARY OF THE INVENTION

Problems to be Solved by the Invention

Although a groove portion for forming an element separating unit is formed by dry etching in general in a solid-state imaging device, an interface state due to a crystal defect, dangling bond and the like increases and dark current is likely to be generated on a surface (especially, an inner peripheral surface and a bottom surface of the groove portion) of a semiconductor substrate processed by the dry etching.

Therefore, a method of forming a negative fixed charge film on a surface of a planar portion of the semiconductor substrate and the inner peripheral surface and the bottom surface of the groove portion for inhibiting an increase and generation of the dark current is known; however, a phenomenon that the fixed charge film is peeled on the semiconductor substrate occurs.

The present technology is achieved in consideration of such a condition, and an object thereof is to satisfy both inhibition of the dark current and inhibition of peeling of the fixed charge film in the solid-state imaging device.

Solutions to Problems

A solid-state imaging device according to a first aspect of the present technology is a solid-state imaging device including a semiconductor substrate in which a plurality of photoelectric conversion element is formed, a groove portion formed in a depth direction from a light incident side for forming an element separating unit between adjacent photoelectric conversion elements on the semiconductor substrate, a first fixed charge film formed to cover a surface of a planar portion on the light incident side of the semiconductor substrate, and a second fixed charge film formed to cover an inner wall surface of the groove portion formed on the semiconductor substrate.

In the solid-state imaging device according to the first aspect of the present technology, a plurality of photoelectric conversion element is formed in the semiconductor substrate, the groove portion is formed in the depth direction from the light incident side for forming the element separating unit between the adjacent photoelectric conversion elements on the semiconductor substrate, the first fixed charge film is formed to cover the surface of the planar portion on the light incident side of the semiconductor substrate, and the second fixed charge film is formed to cover the inner wall surface of the groove portion formed on the semiconductor substrate.

A manufacturing method according to a second aspect of the present technology is a manufacturing method including steps of forming a groove portion in a depth direction from a light incident side by etching for forming an element separating unit between adjacent photoelectric conversion elements on a semiconductor substrate in which a plurality of photoelectric conversion elements is formed, forming a second fixed charge film according to an amount of damage received by an inner wall surface of the groove portion from the etching so as to cover the inner wall surface of the groove portion formed on the semiconductor substrate, and forming a first fixed charge film according to an amount of damage received by a planar portion from the etching so as to cover a surface of the planar portion on the light incident side of the semiconductor substrate.

According to the manufacturing method according to the second aspect of the present technology, the groove portion is formed in the depth direction from the light incident side by etching for forming the element separating unit between the adjacent photoelectric conversion elements on the semiconductor substrate in which a plurality of photoelectric conversion elements is formed, the second fixed charge film according to the amount of the damage received by the inner wall surface of the groove portion from the etching is formed so as to cover the inner wall surface of the groove portion formed on the semiconductor substrate, and the first fixed charge film according to the amount of the damage received by the planar portion from the etching is formed so as to cover the surface of the planar portion on the light incident side of the semiconductor substrate.

A manufacturing method according to a third aspect of the present technology is a manufacturing method including steps of forming a first fixed charge film according to an amount of damage received by a planar portion from etching for forming a groove portion on a semiconductor substrate so as to cover a surface of the planar portion on a light incident side of the semiconductor substrate in which a plurality of photoelectric conversion elements is formed, forming the groove portion in a depth direction from the light incident side by the etching for forming an element separating unit between adjacent photoelectric conversion elements on the semiconductor substrate covered with the first fixed charge film, and forming a second fixed charge film according to an amount of damage received by an inner wall surface of the groove portion from the etching so as to cover the inner wall surface of the groove portion formed on the semiconductor substrate.

In the manufacturing method according to the third aspect of the present technology, the first fixed charge film according to the amount of the damage received by the planar portion from etching for forming the groove portion on the semiconductor substrate is formed so as to cover the surface of the planar portion on the light incident side of the semiconductor substrate in which a plurality of photoelectric conversion elements is formed, the groove portion is formed in the depth direction from the light incident side by the etching for forming the element separating unit between the adjacent photoelectric conversion elements on the semiconductor substrate covered with the first fixed charge film, and the second fixed charge film according to the amount of the damage received by the inner wall surface of the groove portion from the etching is formed so as to cover the inner wall surface of the groove portion formed on the semiconductor substrate.

An electronic device according to a fourth aspect of the present technology is an electronic device including a solid-state imaging device including a semiconductor substrate in which a plurality of photoelectric conversion elements is formed, a groove portion formed in a depth direction from a light incident side for forming an element separating unit between adjacent photoelectric conversion elements on the semiconductor substrate, a first fixed charge film formed so as to cover a surface of a planar portion on the light incident side of the semiconductor substrate, and a second fixed charge film formed so as to cover an inner wall surface of the groove portion formed on the semiconductor substrate.

In the solid-state imaging device provided in the electronic device according to the fourth aspect of the present technology, a plurality of photoelectric conversion elements is formed in the semiconductor substrate, the groove portion is formed in the depth direction from the light incident side for forming the element separating unit between the adjacent photoelectric conversion elements on the semiconductor substrate, the first fixed charge film is formed so as to cover the surface of the planar portion on the light incident side of the semiconductor substrate, and the second fixed charge film is formed so as to cover the inner wall surface of the groove portion formed on the semiconductor substrate.

Effects of the Invention

According to the first to fourth aspects of the present technology, it is possible to inhibit peeling of a fixed charge film while inhibiting dark current.

Meanwhile, the effects are not necessarily limited to the effects herein described and may include any of the effects described in the present disclosure.

MODE FOR CARRYING OUT THE INVENTION

Embodiments of the present technology are hereinafter described with reference to the drawings. Meanwhile, the description is given in the following order.
 1. First Embodiment (Solid-state Imaging Device)
 2. Second Embodiment (Solid-state Imaging Device)
 3. Variation
 4. Configuration of Electronic Device
 5. Usage Example of Solid-state Imaging Device 1. First Embodiment Configuration of Solid-State Imaging Device FIG. 1 is a view illustrating a configuration example of a solid-state imaging device.

Figure 1:
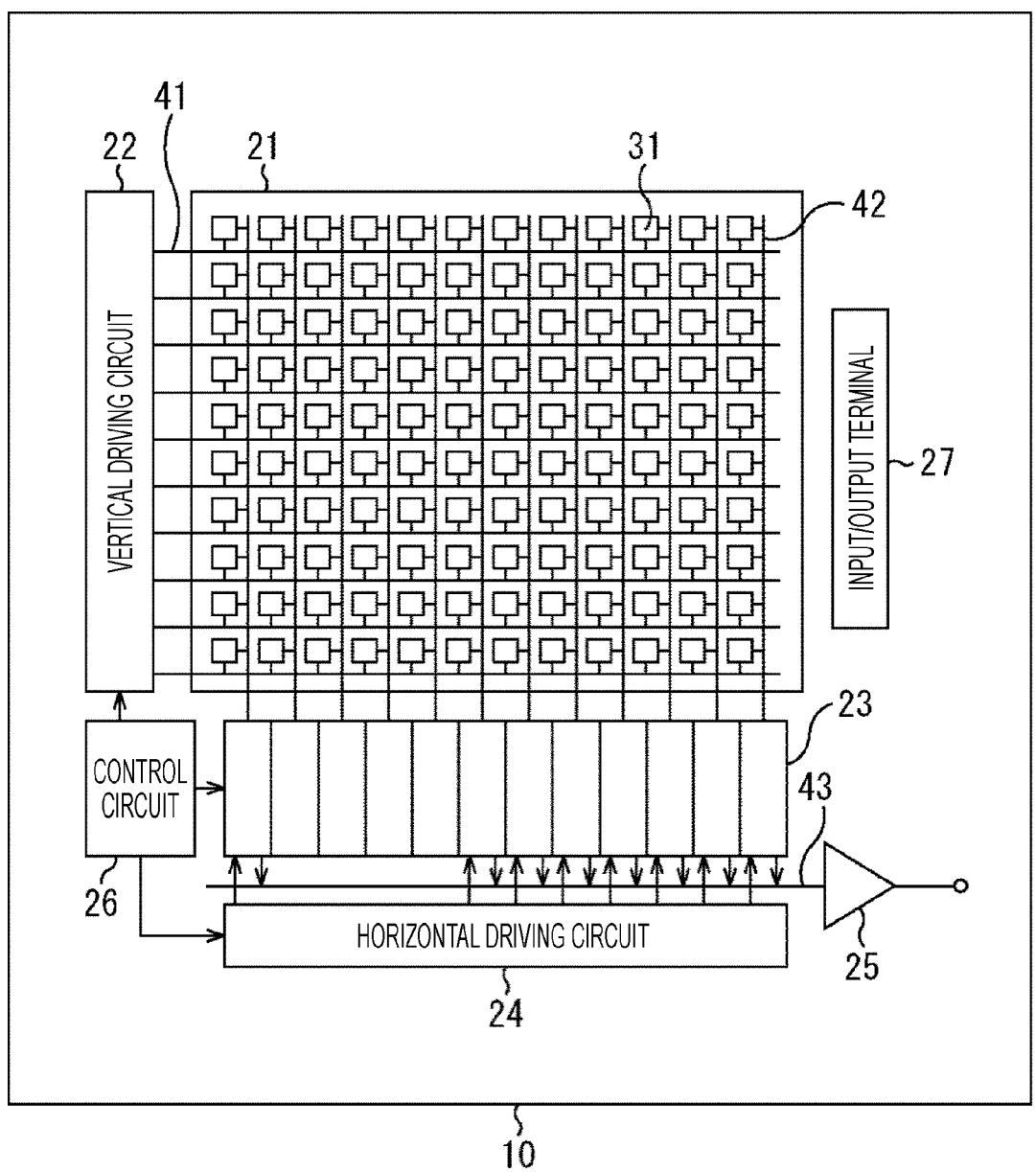
FIG. 1 is a view illustrating a configuration example of a solid-state imaging device.

A solid-state imaging device 10 in FIG. 1 is, for example, an image sensor such as a complementary metal oxide semiconductor (CMOS) image sensor. The solid-state imaging device 10 captures incident light (image light) from an object through an optical lens system (not illustrated) and converts an amount of the incident light an image of which is formed on an imaging surface to an electric signal in a pixel unit to output as a pixel signal.

In FIG. 1, the solid-state imaging device 10 includes a pixel array unit 21, a vertical driving circuit 22, a column signal processing circuit 23, a horizontal driving circuit 24, an output circuit 25, a control circuit 26, and an input/output terminal 27.

Unit pixels 31 are arranged to form a two-dimensional array in the pixel array unit 21. The unit pixel 31 includes a photodiode as a photoelectric conversion element and a plurality of pixel transistors.

The vertical driving circuit 22 formed of a shift register, for example, selects predetermined pixel driving wiring 41 and supplies a pulse for driving the unit pixel 31 to the selected pixel driving wiring 41 to drive the unit pixels 31 row by row. That is to say, the vertical driving circuit 22 sequentially selects to scan the unit pixels 31 of the pixel array unit 21 row by row in a vertical direction and supplies the pixel signal based on a signal charge generated according to an amount of received light in the photoelectric conversion element of each unit pixel 31 to the column signal processing circuit 23 through a vertical signal line 42.

The column signal processing circuits 23 arranged for respective columns of the unit pixels 31 perform signal processing such as noise removal on the signals output from the unit pixels 31 of one row for respective pixel columns. For example, the column signal processing circuit 23 performs the signal processing such as correlated double sampling (CDS) for removing a fixed pattern noise peculiar to a pixel and analog digital (AD) conversion.

The horizontal driving circuit 24 formed of a shift register, for example, selects the column signal processing circuits 23 in turn by sequentially outputting horizontal scanning pulses and allows each of the column signal processing circuits 23 to output the pixel signal to a horizontal signal line 43.

The output circuit 25 performs signal processing on the signals sequentially supplied from the respective column signal processing circuits 23 through the horizontal signal line 43 to output. There is a case in which the output circuit 25 merely buffers, for example, or a case in which this performs black level adjustment, column variation correction, various types of digital signal processing and the like.

The control circuit 26 receives an input clock signal and data ordering an operation mode and the like and outputs data of internal information and the like of the solid-state imaging device 10. That is to say, the control circuit 26 generates a clock signal and a control signal serving as a reference of operation of the vertical driving circuit 22, the column signal processing circuit 23, the horizontal driving circuit 24 and the like on the basis of a vertical synchronization signal, a horizontal synchronization signal, and a master clock signal. Then, the control circuit 26 outputs the generated clock signal and control signal to the vertical driving circuit 22, the column signal processing circuit 23, the horizontal driving circuit 24 and the like.

The input/output terminal 27 communicates signals with the outside.

The solid-state imaging device 10 in FIG. 1 configured in the above-described manner is the CMOS image sensor referred to as a column AD type in which the column signal processing circuit 23 which performs CDS processing and AD conversion processing is arranged for each pixel column.

Detailed Structure of Solid-State Imaging Device

Figure 2:
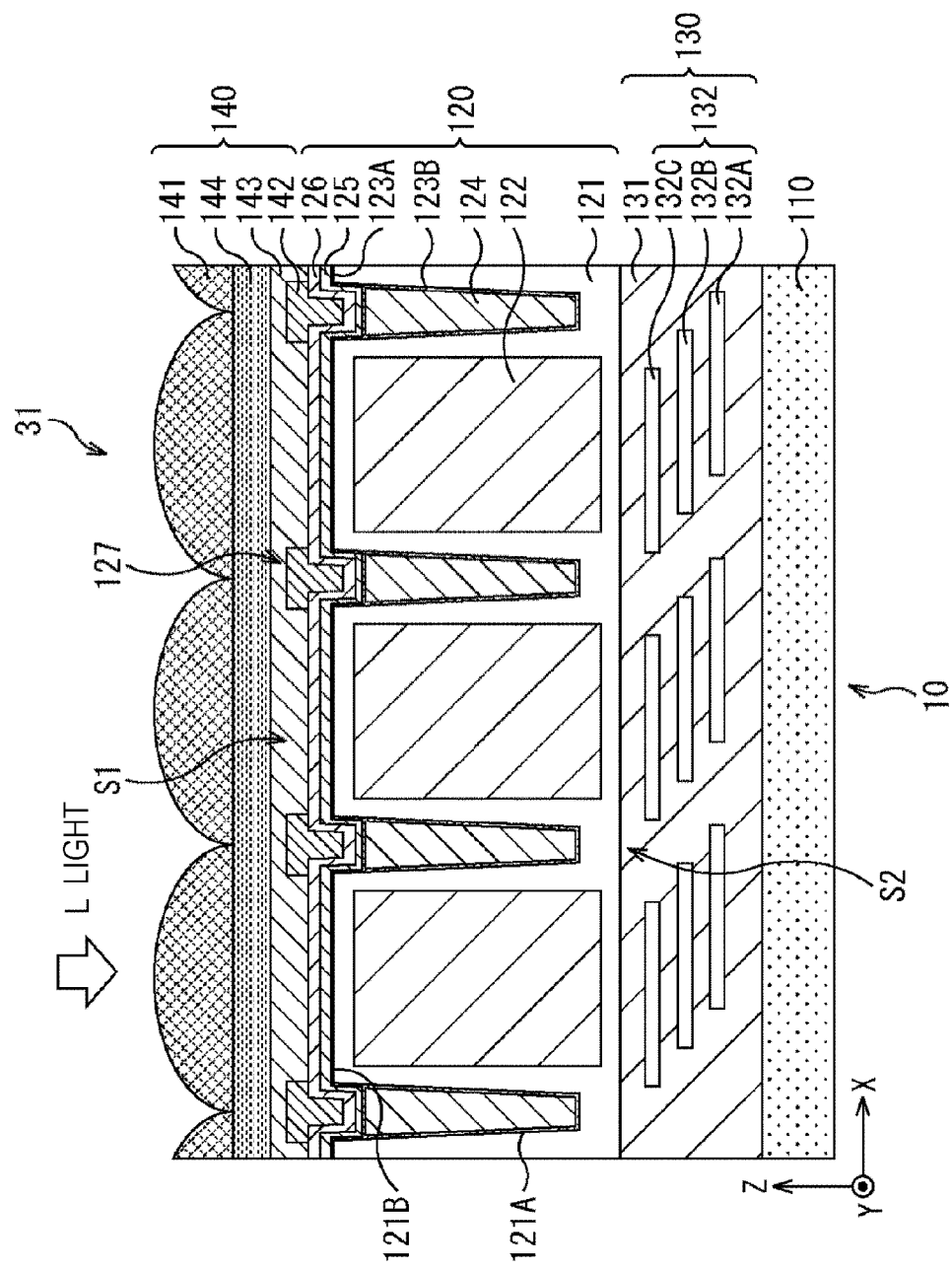
FIG. 2 is an enlarged cross-sectional view illustrating a part of the solid-state imaging device.

Next, a detailed structure of the solid-state imaging device 10 in FIG. 1 is described. FIG. 2 is an enlarged cross-sectional view illustrating a part of the solid-state imaging device 10. In FIG. 2, a backside illumination CMOS image sensor is illustrated as the solid-state imaging device 10.

In FIG. 2, the unit pixel 31 forms one pixel out of the two-dimensional array in the pixel array unit 21 in the solid-state imaging device 10. Also, in FIG. 2, a wiring layer 130 and a supporting substrate 110 are formed on a front surface side (surface S2 side in the drawing) of a semiconductor substrate 121 forming a light receiving layer 120 and a light condensing layer 140 is formed on a back surface side (surface S1 side in the drawing) of the semiconductor substrate 121. Meanwhile, pixel transistors such as a transfer transistor, a reset transistor, an amplification transistor, and a selection transistor are formed on the front surface side of the semiconductor substrate 121.

In the light receiving layer 120, the semiconductor substrate 121 is formed of p-type silicon (Si), for example, in which a photodiode 122 as the photoelectric conversion element is buried. Also, in the light receiving layer 120, a groove portion 121A extending in a depth direction (Z direction) of the semiconductor substrate 121 is formed between the unit pixels on the back surface side (surface S1 side in the drawing) of the semiconductor substrate 121.

A planar portion 121B (on the back surface side (light incident side)) of the semiconductor substrate 121 and the groove portion 121A formed on the semiconductor substrate 121 are covered with a negative fixed charge film such as a first fixed charge film 123A or a second fixed charge film 123B. Then, an insulating film 124, an antireflection film 125, an insulating film 126, and a light shielding film 142 are buried in this order in the groove portion 121A covered with the negative fixed charge film to form an element separating unit 127. That is to say, the element separating unit 127 is formed into a lattice shape so as to enclose the unit pixel 31, and the photodiodes 122 are electrically separated from one another by the element separating units 127.

Herein, in the semiconductor substrate 121, the first fixed charge film 123A is formed to cover all or a large part of a surface of the planar portion 121B and the second fixed charge film 123B is formed to cover all or a large part of a bottom surface and an inner peripheral surface of the groove portion 121A. Meanwhile, the bottom surface and the inner peripheral surface of the groove portion 121A are hereinafter collectively referred to as an "inner wall surface".

The negative fixed charge film according to an amount of damage which the planar portion 121B receives from etching for forming the groove portion 121A on the semiconductor substrate 121 is used as the first fixed charge film 123A. For example, as the first fixed charge film 123A, a material such as a hafnium oxide ($HfO_2$) film deposited on the planar portion 121B of the semiconductor substrate 121 to inhibit occurrence of blister, the material which is not peeled from the planar portion 121B is preferably used.

The negative fixed charge film according to an amount of damage which the inner wall surface of the groove portion 121A receives from the etching for forming the groove portion 121A on the semiconductor substrate 121 is used as the second fixed charge film 123B. For example, as the second fixed charge film 123B, a material such as an aluminum oxide ($Al_2O_3$) film deposited on the semiconductor substrate 121 to generate a fixed charge, thereby strengthening pinning of the groove portion 121A is preferably used.

Meanwhile, a high refractive index material film or a high dielectric film having a negative charge, that is to say, an oxide or a nitride containing at least one element out of hafnium (Hf), aluminum (Al), zirconium (Zr), tantalum (Ta), and titanium (Ti), for example, may be applied to the second fixed charge film 123B.

The insulating film 124 is formed so as to be buried in the groove portion 121A covered with the second fixed charge film 123B. The insulating film 124 is preferably formed of a material having a refractive index different from that of the second fixed charge film 123B such as an oxide film, for example. Meanwhile, silicon oxide ($SiO_2$), silicon nitride ($Si_3N_4$), silicon oxynitride (SiON), a resin or the like may be used, for example, as the material of the insulating film 124.

The antireflection film 125 is formed on the first fixed charge film 123A and a part thereof is buried in the groove portion 121A. An insulating film (low reflection film) having an optical function such as a silicon nitride film ($Si_3N_4$) may be used, for example, as a material of the antireflection film 125. The insulating film 126 is formed on the antireflection film 125 and a part thereof is buried in the groove portion 121A. An oxide film and the like may be used, for example, as a material of the insulating film 126.

The light shielding film 142 is formed in a predetermined region on the insulating film 126 buried in the groove portion 121A and is formed into a lattice shape so as to form opening on the photodiode 122 in a pixel region. A material which shields light may be used as a material of the light shielding film 142; for example, aluminum (Al), tungsten (W), copper (Cu) or the like may be used.

A planarizing film 143 is formed on an entire insulating film 126 including the light shielding film 142. According to this, a surface on the back surface side of the semiconductor substrate 121 is planarized. An organic material such as a resin may be used, for example, as a material of the planarizing film 143.

A color filter layer 144 is formed on the planarizing film 143. The color filter layer 144 is formed so as to correspond to red (R), green (G), and blue (B), for example, for respective unit pixels 31. Light of a desired wavelength is transmitted through the color filter layer 144 and transmitted light is incident on the photodiode 122 formed in the semiconductor substrate 121.

An on-chip lens 141 is formed on the color filter layer 144. Irradiation light is condensed by the on-chip lens 141 and the condensed light is efficiently incident on the photodiode 122 efficiently through the color filter layer 144.

The on-chip lens 141, the color filter layer 144, the planarizing film 143, and the light shielding film 142 form the light condensing layer 140 on the back surface side (surface S1 side in the drawing) of the semiconductor substrate 121. Also, the wiring layer 130 formed on the front surface side (surface S2 side in the drawing) of the semiconductor substrate 121 is formed of wiring 132A to wiring 132C stacked to form a plurality of layers (three layers in FIG. 2) through an interlayer insulating film 131. The pixel transistor of the unit pixel 31 is driven through the wiring 132 formed in the wiring layer 130.

The supporting substrate 110 is formed on a side opposite to a side facing the semiconductor substrate 121 of the wiring layer 130. The supporting substrate 110 formed for securing strength of the semiconductor substrate 121 in a manufacturing phase is formed of a silicon substrate, for example.

In the solid-state imaging device 10 having the above-described configuration, light is applied from the back surface side of the semiconductor substrate 121 and the light transmitted through the on-chip lens 141 and the color filter layer 144 is subjected to photoelectric conversion by the photodiode 122, so that the signal charge is generated. Then, the signal charge generated by the photodiode 122 is output as the pixel signal through a signal line formed of predetermined wiring 132 in the wiring layer 130 through the pixel transistor formed on the front surface side of the semiconductor substrate 121.

Detailed Structure of Element Separating Unit

Next, a detailed structure of the element separating unit 127 in FIG. 2 is described. A detailed structure of a first element separating unit 127-1 corresponding to the element separating unit 127 in FIG. 2 and a detailed structure of a second element separating unit 127-2 as a variation thereof are herein described.

Cross-Sectional Structure of First Element Separating Unit

Figure 3:
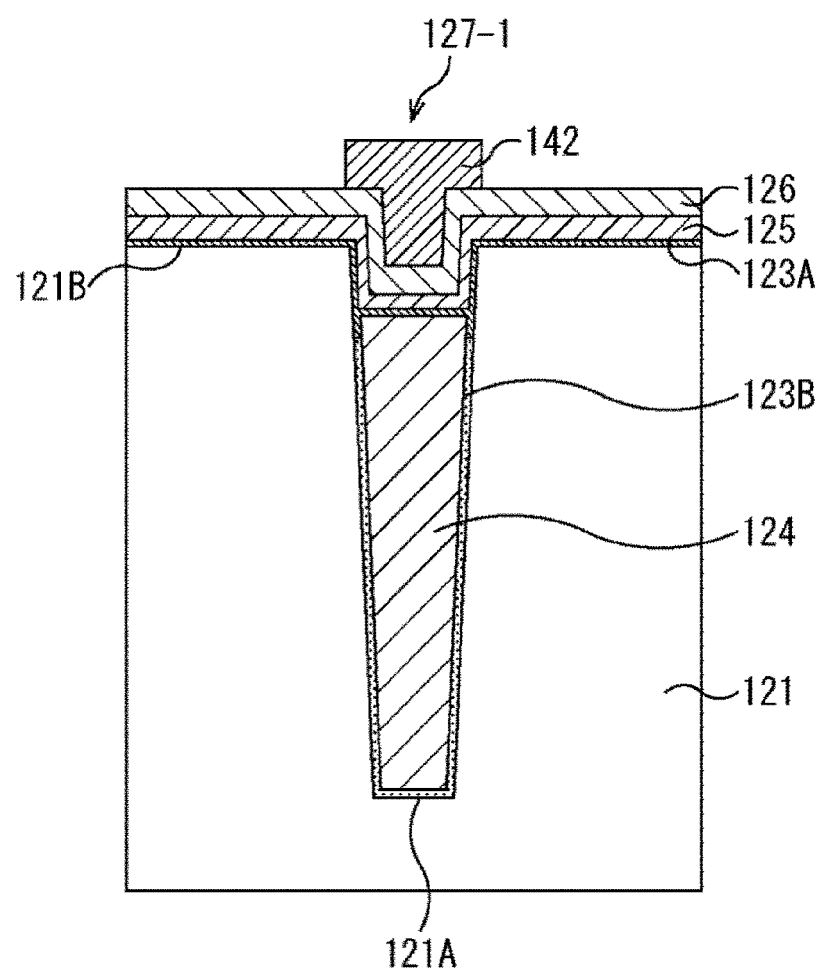
FIG. 3 is a view illustrating a cross-sectional structure of a periphery of a first element separating unit.

FIG. 3 is a view illustrating a cross-sectional structure of a periphery of the first element separating unit 127-1.

In the first element separating unit 127-1 in FIG. 3, the groove portion 121A is formed in the depth direction from the back surface side of the semiconductor substrate 121 and the inner wall surface thereof is covered with the first and second fixed charge films 123A and 123B.

Specifically, in the first element separating unit 127-1, the bottom surface of the groove portion 121A is covered with the second fixed charge film 123B. On the other hand, although the large part of the inner peripheral surface of the groove portion 121A is covered with the second fixed charge film 123B, a part on a side near the planar portion 121B of the semiconductor substrate 121 is covered with the first fixed charge film 123A. Also, the surface of the planar portion 121B of the semiconductor substrate 121 is covered with the first fixed charge film 123A. That is to say, on the surface (silicon surface) of the semiconductor substrate 121, the negative fixed charge film is switched from the first fixed charge film 123A to the second fixed charge film 123B in a certain portion in the groove portion 121A.

In the first element separating unit 127-1, the insulating film 124 is formed in the groove portion 121A covered with the first and second fixed charge films 123A and 123B. An upper portion (upper surface) of the insulating film 124 is covered with the first fixed charge film 123A. Also, the antireflection film 125 and the insulating film 126 are formed on the first fixed charge film 123A to have a concave shape corresponding to a dug portion of the groove portion 121A. Then, the light shielding film 142 is formed so as to be buried in the concave portion.

As described above, in the semiconductor substrate 121 on which the first element separating unit 127-1 is formed, the inner wall surface of the groove portion 121A and the surface of the planar portion 121B are covered with any one of two types of negative fixed charge films 123 having different characteristics. For example, when the aluminum oxide ($Al_2O_3$) film is used as the second fixed charge film 123B covering the inner wall surface of the groove portion 121A formed on the semiconductor substrate 121, the pinning is strengthened and occurrence of dark current may be inhibited. Also, for example, when the hafnium oxide ($HfO_2$) film is used as the first fixed charge film 123A covering the surface of the planar portion 121B of the semiconductor substrate 121, the occurrence of the blister is inhibited and peeling of the negative fixed charge film from the planar portion 121B may be inhibited. As a result, it is possible to satisfy both inhibition of the dark current and inhibition of the peeling of the fixed charge film in the solid-state imaging device 10.

A reason why such an effect may be obtained is as follows in detail. That is to say, the groove portion 121A of the element separating unit 127-1 formed into a lattice shape so as to enclose the unit pixel 31 is formed by dry etching in general, and it is known that an interface state due to a crystal defect, dangling bond and the like increases and the dark current is likely to be generated on the surface (especially, the bottom surface and the inner peripheral surface of the groove portion 121A) of the semiconductor substrate 121 processed by the dry etching. Also, although it is required to form a narrower groove portion 121A in order to downsize the unit pixel 31 and form a deeper groove portion 121A in order to inhibit color mixing; however, when both requirements are satisfied, the damage due to the dry etching increases in general and the dark current tends to increase due to an increase in crystal defect and dangling bond.

When the inner wall surface of the groove portion 121A formed on the semiconductor substrate 121 and the surface of the planar portion 121B of the semiconductor substrate 121 are covered with the same negative fixed charge film (for example, the aluminum oxide ($Al_2O_3$) film) in order to inhibit the increase and generation of the dark current, hydrogen of a terminal group of silicon and at the time of stacking an upper layer structure is accumulated on an interface between the fixed charge film and silicon and the fixed charge film is peeled on the planar portion 121B of the semiconductor substrate 121. Incidence of the peeling of the fixed charge film differs depending on a planar direction of silicon; the peeling is less likely to occur on a processed surface such as the groove portion 121A but likely to occur on the planar portion 121B.

Then, in the present technology, different negative fixed charge films are used to cover the inner wall surface of the groove portion 121A and to cover the surface of the planar portion 121B depending on the damage amounts focusing on difference in crystal defect and dangling bond amounts due to difference in the amount of the damage received from the dry etching for forming the groove portion 121A on the semiconductor substrate 121 between the inner wall surface of the groove portion 121A formed on the semiconductor substrate 121 and the surface of the planar portion 121B of the semiconductor substrate 121.

That is to say, the negative fixed charge film (for example, the aluminum oxide ($Al_2O_3$) film and the like) according to the amount of the damage which the inner wall surface of the groove portion 121A receives from the dry etching is used as the second fixed charge film 123B covering the inner wall surface of the groove portion 121A, and the negative fixed charge film (for example, the hafnium oxide ($HfO_2$) film and the like) according to the amount of the damage which the planar portion 121B receives from the dry etching is used as the first fixed charge film 123A covering the surface of the planar portion 121B. According to this, the generation of the dark current is inhibited by the second fixed charge film 123B covering the inner wall surface of the groove portion 121A and the peeling of the fixed charge film may be inhibited by the first fixed charge film 123A covering the surface of the planar portion 121B.

For comparison, when the inner wall surface of the groove portion 121A and the surface of the planar portion 121B are covered only with the first fixed charge film 123A (for example, the hafnium oxide ($HfO_2$) film and the like) in the first element separating unit 127-1, the peeling of the fixed charge film may be inhibited but the generation of the dark current cannot be inhibited. On the other hand, when the inner wall surface of the groove portion 121A and the surface of the planar portion 121B are covered only with the second fixed charge film 123B (for example, the aluminum oxide ($Al_2O_3$) film and the like) in the first element separating unit 127-1, the generation of the dark current may be inhibited but the peeling of the fixed charge film cannot be inhibited.

In this manner, although strengthening of the pinning of the groove portion 121A formed on the semiconductor substrate 121 and the inhibition of the occurrence of the blister on the planar portion 121B of the semiconductor substrate 121 are in a trade-off relationship, it is possible to satisfy both the inhibition of the dark current and the inhibition of the peeling of the fixed charge film in the solid-state imaging device 10 by adopting the structure of the first element separating unit 127-1 in FIG. 3.

Meanwhile, although a shape of the groove portion 121A is illustrated to be a trapezoidal shape narrowing in the depth direction from the back surface side of the semiconductor substrate 121 in FIG. 3, this shape is not limited to the trapezoidal shape but may also be a rectangular shape, for example. The same applies to other drawings to be described later.

Cross-Sectional Structure of Second Element Separating Unit

Figure 4:
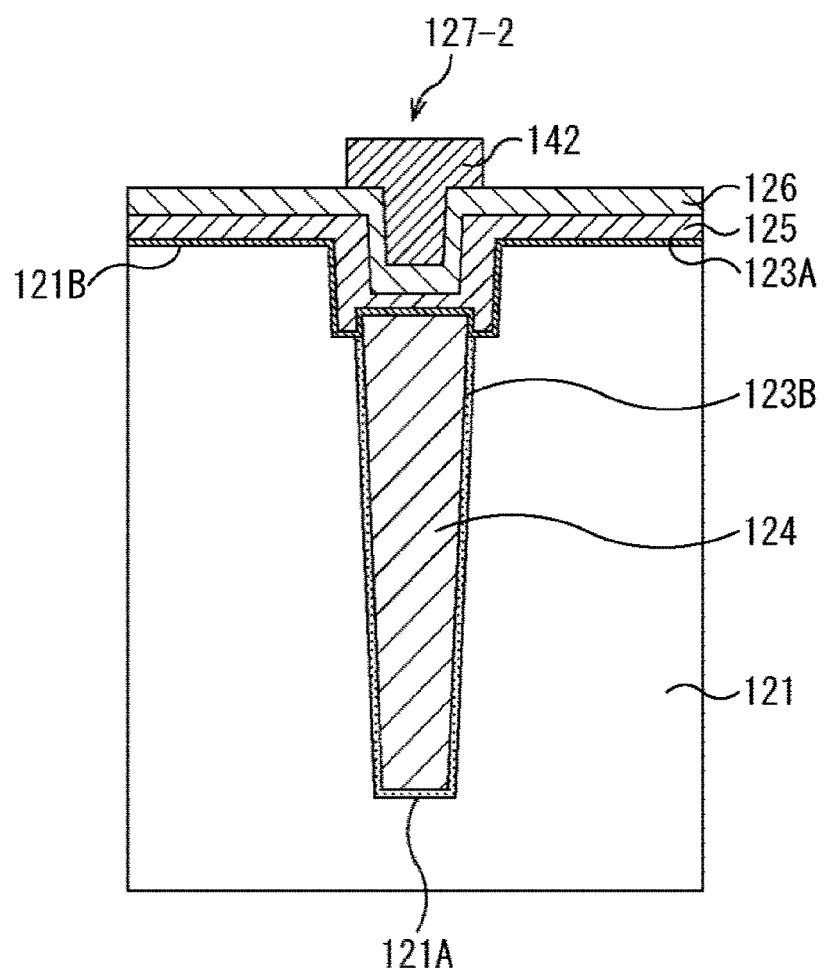
FIG. 4 is a view illustrating a cross-sectional structure of a periphery of a second element separating unit.

FIG. 4 is a view illustrating a cross-sectional structure of a periphery of a second element separating unit 127-2.

In FIG. 4, as compared to the first element separating unit 127-1 in FIG. 3, the second element separating unit 127-2 has the inner peripheral surface covered with the first fixed charge film 123A and the inner peripheral surface covered with the second fixed charge film 123B with different widths in the groove portion 121A formed on the semiconductor substrate 121.

Specifically, in the second element separating unit 127-2, the bottom surface of the groove portion 121A is covered with the second fixed charge film 123B. On the other hand, although the large part of the inner peripheral surface of the groove portion 121A is covered with the second fixed charge film 123B, a part with a larger width on a side near the planar portion 121B of the semiconductor substrate 121 is covered with the first fixed charge film 123A. Also, the surface of the planar portion 121B of the semiconductor substrate 121 is covered with the first fixed charge film 123A. That is to say, on the surface (silicon surface) of the semiconductor substrate 121, the negative fixed charge film is switched from the first fixed charge film 123A to the second fixed charge film 123B in a portion in which the groove portion 121A becomes narrower.

In the semiconductor substrate 121 on which the second element separating unit 127-2 having the above-described structure is formed, the blister occurring on the planar portion 121B is inhibited by the first fixed charge film 123A formed of the hafnium oxide ($HfO_2$) film and the like, for example, and in contrast, the pinning of the groove portion 121A is strengthened by the second fixed charge film 123B formed of the aluminum oxide ($Al_2O_3$) film and the like, for example. As a result, it is possible to satisfy both inhibition of the dark current and inhibition of the peeling of the fixed charge film in the solid-state imaging device 10.

(First Manufacturing Step)

Next, a first manufacturing step of forming the first element separating unit 127-1 in FIG. 3 is described.

Figure 5:
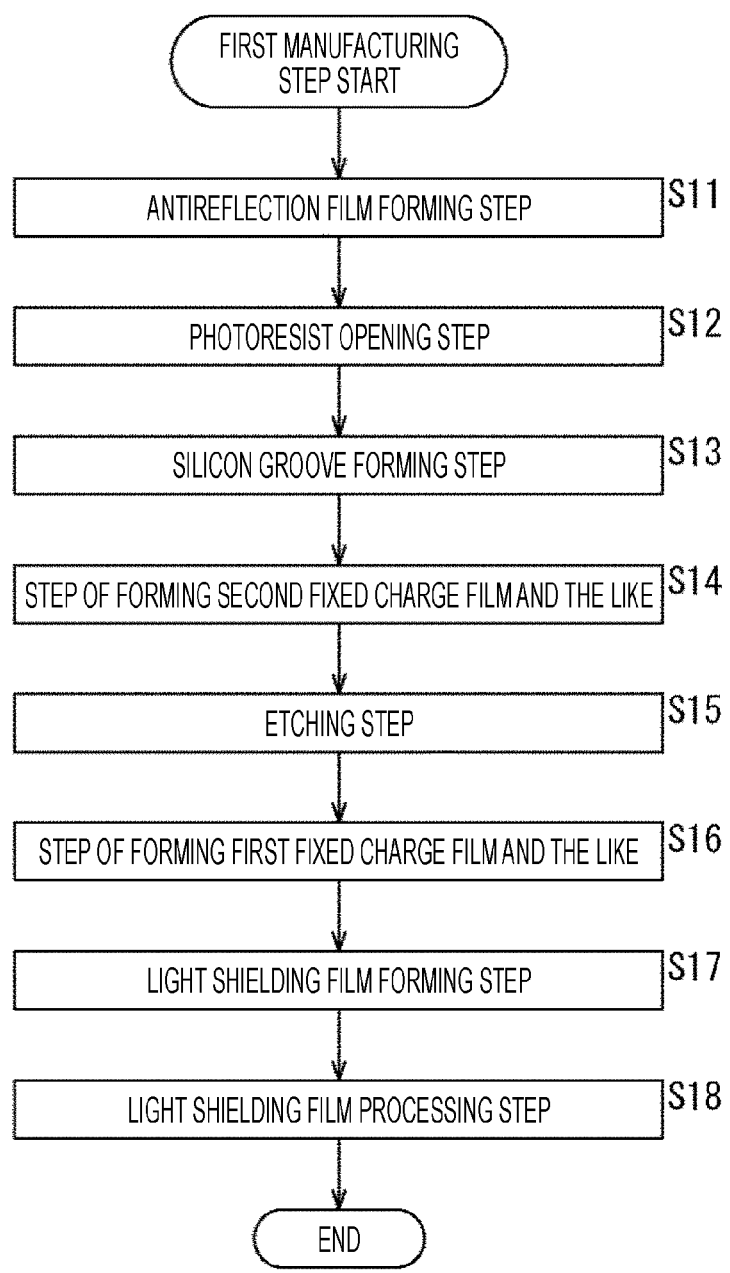
FIG. 5 is a view illustrating a flow of a first manufacturing step.
Figure 6:
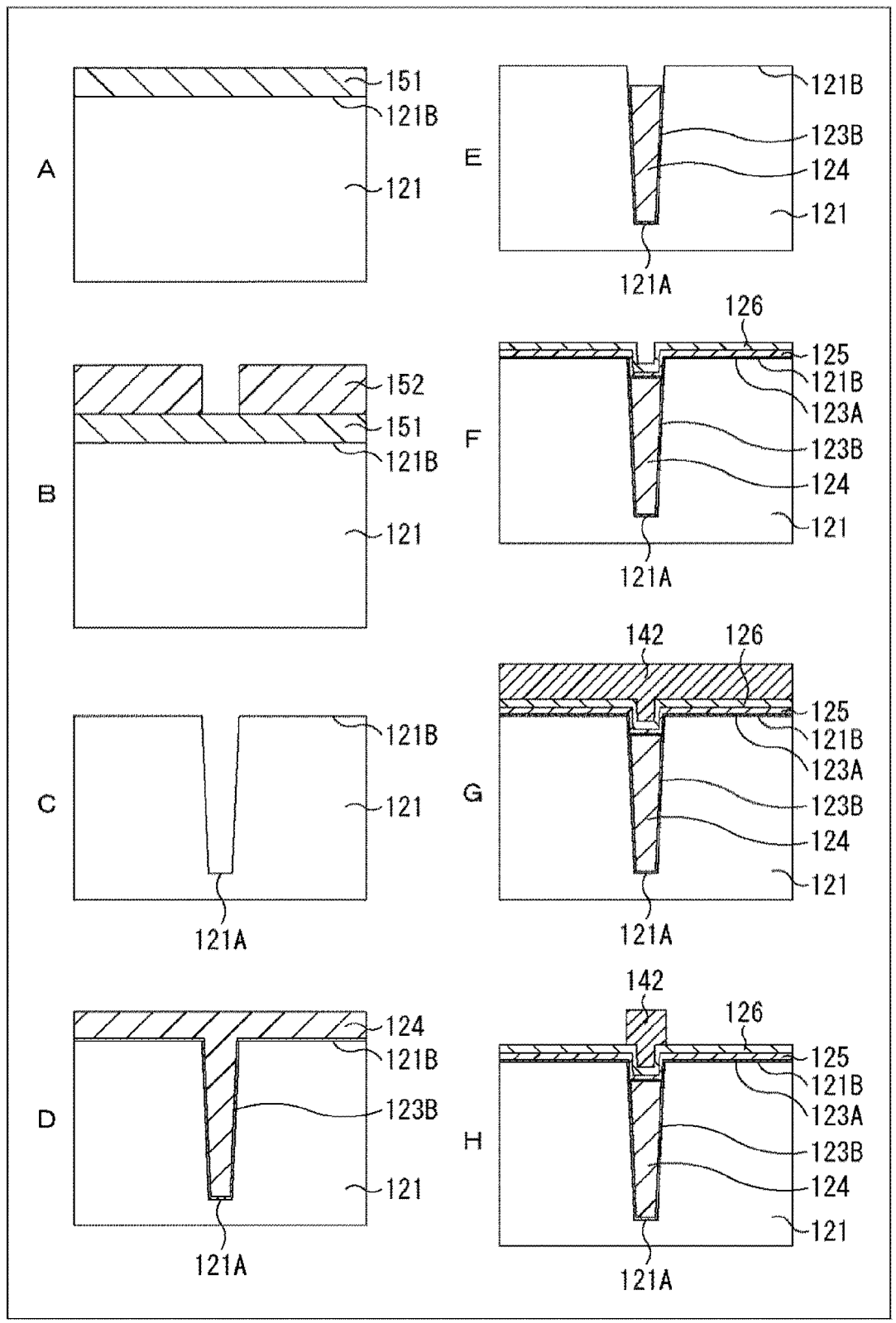
FIG. 6 is a view schematically illustrating each step at the first manufacturing step.

FIG. 5 is a view illustrating a flow of the first manufacturing step. Meanwhile, schematic diagrams corresponding to respective steps in FIG. 5 are illustrated in FIG. 6 and it is described with reference to the schematic diagrams appropriately.

At step S11, an antireflection film forming step is performed. At the antireflection film forming step, as illustrated in A of FIG. 6, a low antireflection film 151 is formed on the semiconductor substrate 121.

At step S12, a photoresist opening step is performed. At the photoresist opening step, as illustrated in B of FIG. 6, a photoresist 152 is formed on the low antireflection film 151 formed at the step at step S11 and opened. This opening is made for forming the groove portion 121A between the unit pixels 31; a width thereof may be set to approximately 0.1 µm to 0.3 µm, for example, depending on the size of the unit pixel 31.

A silicon groove forming step is performed at step S13. At the silicon groove forming step, as illustrated in C of FIG. 6, the dry etching is performed on the photoresist 152 opened at the step at step S12, thereby opening the low antireflection film 151 to further form the groove portion 121A on the semiconductor substrate 121 formed of silicon (Si).

Meanwhile, it is sufficient that the groove portion 121A has a depth with which cross-talk may be controlled; this is, for example, not less than 0.25 µm and not greater than 5 µm. Also, it is sufficient that the groove portion 121A has a width with which the cross-talk may be controlled; this is, for example, not less than 100 nm and not greater than 1000 nm.

A step of forming the second fixed charge film and the like is performed at step S14. At the step of forming the second fixed charge film and the like, as illustrated in D of FIG. 6, the inner wall surface of the groove portion 121A formed at the step at step S13 and the surface of the planar portion 121B of the semiconductor substrate 121 are covered with the second fixed charge film 123B and are further blocked with the insulating film 124 deposited by atomic layer deposition (ALD).

Meanwhile, at that time, the inner wall surface of the groove portion 121A formed at the step at step S13 is significantly damaged by the dry etching, so that the negative fixed charge film with stronger pinning according to the damage amount (for example, the aluminum oxide ($Al_2O_3$) film and the like) is used as the second fixed charge film 123B.

At step S15, an etching step is performed. At the etching step, as illustrated in E of FIG. 6, the second fixed charge film 123B and the insulating film 124 on the planar portion 121B and the like of the semiconductor substrate 121 formed at the step at step S14 are removed by the dry etching or wet etching to expose the semiconductor substrate 121.

A step of forming the first fixed charge film and the like is performed at step S16. At the step of forming the first fixed charge film and the like, as illustrated in F of FIG. 6, the first fixed charge film 123A is formed by chemical vapor deposition (CVD) including the atomic layer deposition (ALD) or physical vapor deposition (PVD) in a hollow of the groove portion 121A formed at the step at step S15.

Meanwhile, the blister might occur on the planar portion 121B of the semiconductor substrate 121, so that the negative fixed charge film capable of inhibiting the occurrence of the blister (for example, the hafnium oxide ($HfO_2$) film and the like) is used according to the damage amount by the dry etching at the step at step S13 as the first fixed charge film 123A. Also, at the step of forming the first fixed charge film and the like, the antireflection film 125 and the insulating film 126 are further formed on the first fixed charge film 123A as illustrated in F of FIG. 6.

At step S17, a light shielding film forming step is performed. At the light shielding film forming step, as illustrated in G of FIG. 6, the light shielding film 142 is formed on the insulating film 126 formed at the step at step S16.

At step S18, a light shielding film processing step is performed. At the light shielding film processing step, the light shielding film 142 formed at the step at step S17 is removed by etching such that only a portion of a predetermined region corresponding to the groove portion 121A is left. According to this, the first element separating unit 127-1 including the light shielding film 142 is formed into a lattice shape so as to open on the photodiode 122 in the pixel region.

The first manufacturing step is heretofore described.

Meanwhile, although the case in which the first element separating unit 127-1 in FIG. 3 is formed is described at the above-described first manufacturing step, the second element separating unit 127-2 in FIG. 4 may also be similarly formed. That is to say, when the second element separating unit 127-2 is formed, the groove portion 121A may be formed on the semiconductor substrate 121 such that the width of the inner peripheral surface covered with the first fixed charge film 123A is different from the width of the inner peripheral surface covered with the second fixed charge film 123B at the silicon groove forming step at step S13 in FIG. 5, for example.

Also, it becomes possible to form a structure to form different fixed charge films of two or more types on the inner peripheral surface of the groove portion 121A formed on the semiconductor substrate 121 by using the above-described first manufacturing step. It is also possible to directly form the photoresist 152 on the semiconductor substrate 121 without forming the low antireflection film 151 on the semiconductor substrate 121 while omitting the step at step S11.

2. Second Embodiment (Detailed Structure of Element Separating Unit)

Although a case in which a part of an inner peripheral surface of a groove portion 121A formed on a semiconductor substrate 121 is covered with a first fixed charge film 123A is described in the above-described first embodiment, it is also possible that the inner peripheral surface of the groove portion 121A is covered only with a second fixed charge film 123B. Therefore, a case in which an inner wall surface of the groove portion 121A formed on the semiconductor substrate 121 is covered only with the second fixed charge film 123B and a surface of a planar portion 121B of the semiconductor substrate 121 is covered with the first fixed charge film 123A is next described as a second embodiment.

A detailed structure of a third element separating unit 127-3 as the second embodiment and detailed structures of fourth and fifth element separating units 127-4 and 127-5 as variations thereof are herein described.

(Cross-Sectional Structure of Third Element Separating Unit)

Figure 7:
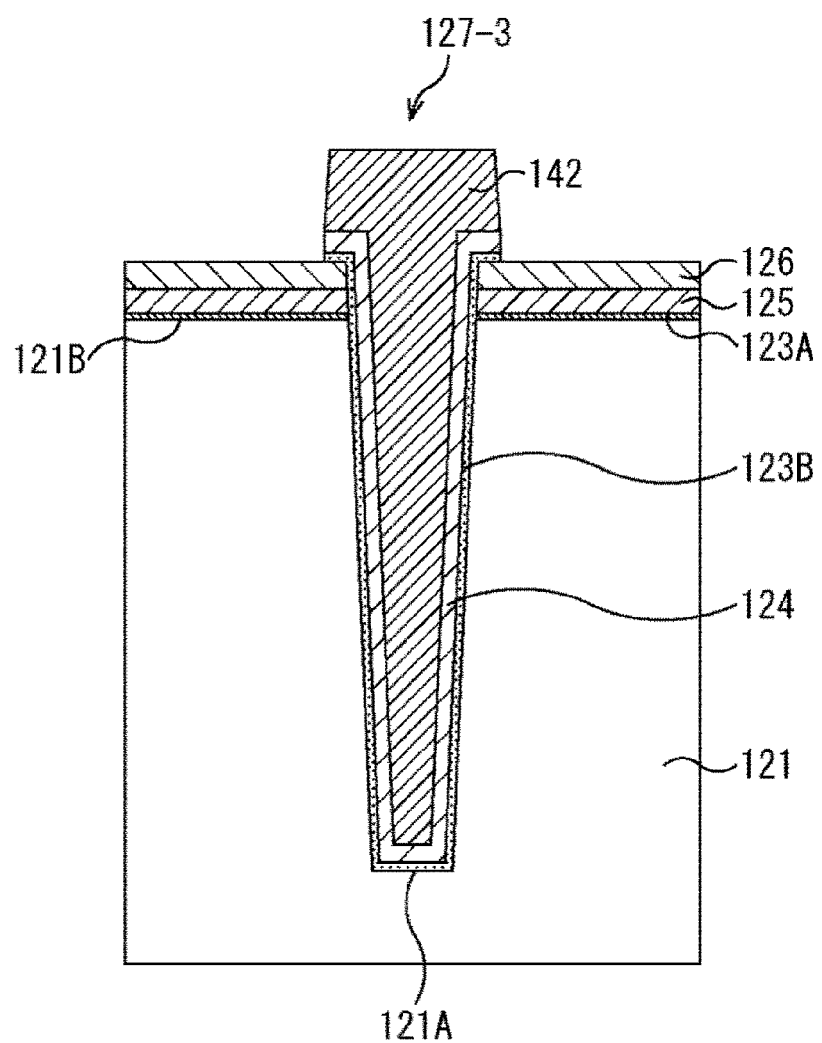
FIG. 7 is a view illustrating a cross-sectional structure of a periphery of a third element separating unit.

FIG. 7 is a view illustrating a cross-sectional structure of a periphery of the third element separating unit 127-3.

In the third element separating unit 127-3 in FIG. 7, the groove portion 121A is formed in a depth direction from a back surface side of the semiconductor substrate 121 and the inner wall surface thereof is covered with the second fixed charge film 123B. Also, in the groove portion 121A, an insulating film 124 is formed on the inner wall surface covered with the second fixed charge film 123B and a light shielding film 142 is further buried therein.

Also, in FIG. 7, the surface of the planar portion 121B of the semiconductor substrate 121 is covered with the first fixed charge film 123A. Furthermore, an antireflection film 125 and an insulating film 126 are formed on the first fixed charge film 123A.

In the semiconductor substrate 121 on which the third element separating unit 127-3 having the above-described structure is formed, blister occurring on the planar portion 121B is inhibited by the first fixed charge film 123A formed of a hafnium oxide (HfO$_2$) film and the like, for example, and in contrast, pinning of the groove portion 121A is strengthened by the second fixed charge film 123B formed of an aluminum oxide (Al$_2$O$_3$) film and the like, for example. As a result, it is possible to satisfy both inhibition of the dark current and inhibition of the peeling of the fixed charge film in the solid-state imaging device 10.

(Cross-Sectional Structure of Fourth Element Separating Unit)

Figure 8:
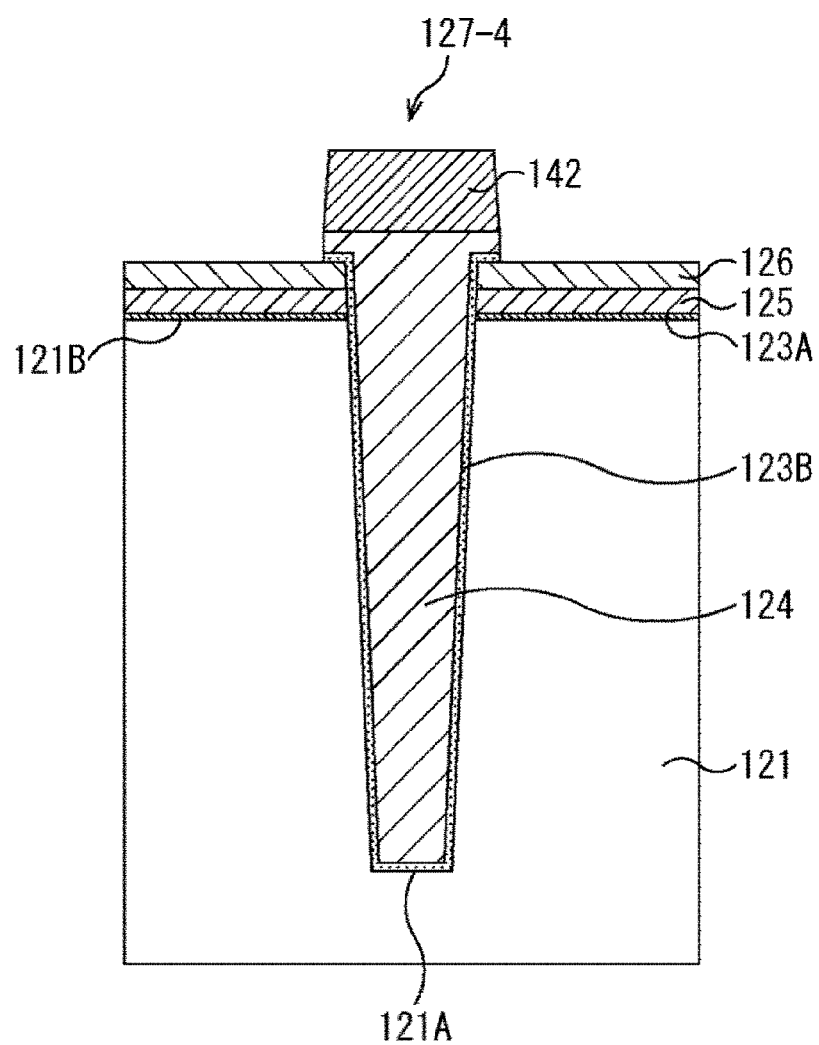
FIG. 8 is a view illustrating a cross-sectional structure of a periphery of a fourth element separating unit.

FIG. 8 is a view illustrating a cross-sectional structure of a periphery of the fourth element separating unit 127-4.

In FIG. 8, the fourth element separating unit 127-4 is different from the third element separating unit 127-3 in FIG. 7 in that only the insulating film 124 is buried in the inner wall surface of the groove portion 121A covered with the second fixed charge film 123B. The light shielding film 142 is formed on the insulating film 124 buried in the groove portion 121A.

Also, in FIG. 8, the surface of the planar portion 121B of the semiconductor substrate 121 is covered with the first fixed charge film 123A. Furthermore, the antireflection film 125 and the insulating film 126 are formed on the first fixed charge film 123A.

In the semiconductor substrate 121 on which the fourth element separating unit 127-4 having the above-described structure is formed, the blister occurring on the planar portion 121B is inhibited by the first fixed charge film 123A formed of the hafnium oxide (HfO$_2$) film and the like, for example, and in contrast, the pinning of the groove portion 121A is strengthened by the second fixed charge film 123B formed of the aluminum oxide (Al$_2$O$_3$) film and the like, for example. As a result, it is possible to satisfy both inhibition of the dark current and inhibition of the peeling of the fixed charge film in the solid-state imaging device 10.

(Cross-Sectional Structure of Fifth Element Separating Unit)

Figure 9:
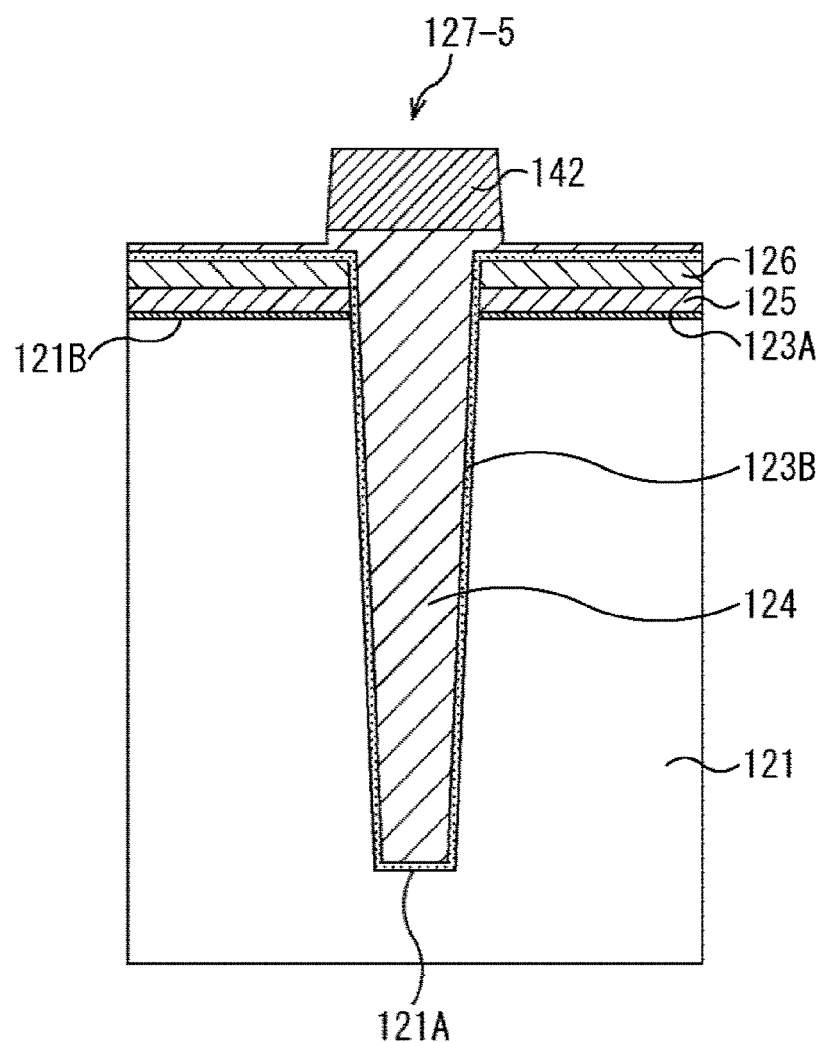
FIG. 9 is a view illustrating a cross-sectional structure of a periphery of a fifth element separating unit.

FIG. 9 is a view illustrating a cross-sectional structure of a periphery of the fifth element separating unit 127-5.

In FIG. 9, the fifth element separating unit 127-5 is different from the third element separating unit 127-3 in FIG. 7 in that the second fixed charge film 123B and the insulating film 124 formed on the inner wall surface of the groove portion 121A are further deposited on an upper surface of the antireflection film 125 and the insulating film 126 formed on the first fixed charge film 123A covering the surface of the planar portion 121B of the semiconductor substrate 121.

Also, in FIG. 9, in the groove portion 121A formed on the semiconductor substrate 121, as is the case with the fourth element separating unit 127-4 in FIG. 8, only the insulating film 124 is buried in the inner wall surface covered with the second fixed charge film 123B.

In the semiconductor substrate 121 on which the fifth element separating unit 127-5 having the above-described structure is formed, the blister occurring on the planar portion 121B is inhibited by the first fixed charge film 123A formed of the hafnium oxide (HfO$_2$) film and the like, for example, and in contrast, the pinning of the groove portion 121A is strengthened by the second fixed charge film 123B formed of the aluminum oxide (Al$_2$O$_3$) film and the like, for example. As a result, it is possible to satisfy both inhibition of the dark current and inhibition of the peeling of the fixed charge film in the solid-state imaging device 10.

(Second Manufacturing Step)

Next, a second manufacturing step of forming the third element separating unit 127-3 in FIG. 7 is described.

Figure 10:
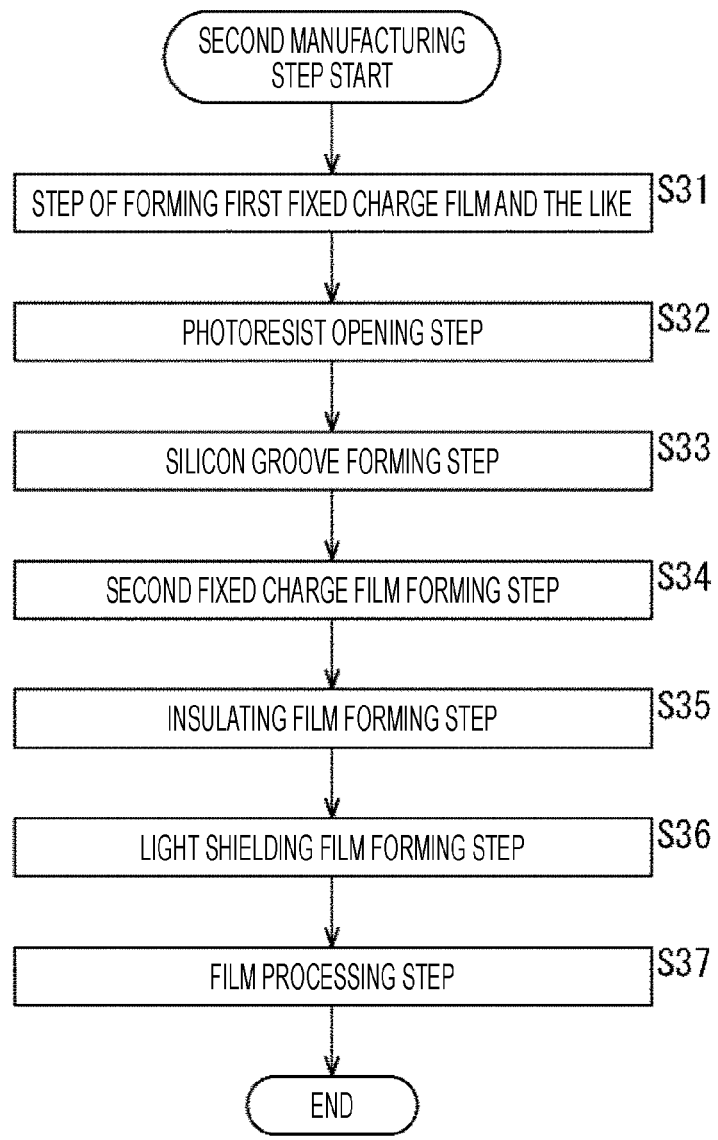
FIG. 10 is a view illustrating a flow of a second manufacturing step.
Figure 11:
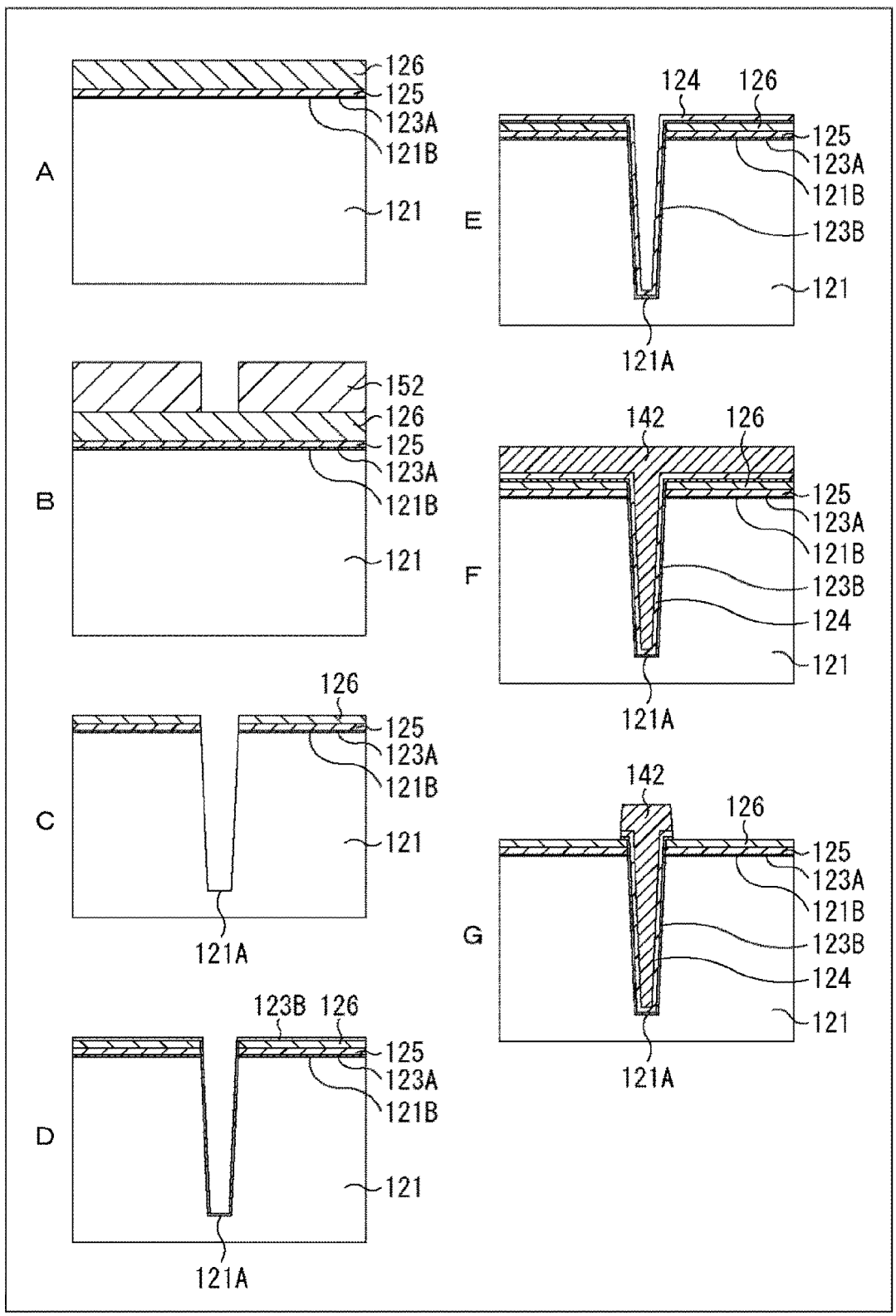
FIG. 11 is a view schematically illustrating each step at the second manufacturing step.

FIG. 10 is a view illustrating a flow of the second manufacturing step. Meanwhile, schematic diagrams corresponding to respective steps in FIG. 10 are illustrated in FIG. 11 and it is described with reference to the schematic diagrams appropriately.

At step S31, a step of forming the first fixed charge film and the like is performed. At the step of forming the first fixed charge film and the like, as illustrated in A of FIG. 11, the first fixed charge film 123A is formed on the surface of the planar portion 121B of the semiconductor substrate 121. Meanwhile, the blister might occur on the planar portion 121B of the semiconductor substrate 121, so that a film capable of inhibiting the blister such as the hafnium oxide (HfO$_2$) film, for example, is used as the first fixed charge film 123A.

Also, at the step of forming the first fixed charge film and the like, the antireflection film 125 and the insulating film 126 are further formed on the first fixed charge film 123A. Meanwhile, the insulating film 126 is herein deposited by a thickness obtained by adding a thickness required as a processing residual film and a thickness lost when the groove portion 121A is formed on the semiconductor substrate 121.

At step S32, a photoresist opening step is performed. At the photoresist opening step, as illustrated in B of FIG. 11, a photoresist 152 is formed on the insulating film 126 formed at the step at step S31 and opened. The opening is made for forming a groove between unit pixels 31; a width thereof may be set to approximately 0.1 μm to 0.3 μm, for example, depending on a size of the unit pixel 31.

At step S33, a silicon groove forming step is performed. At the silicon groove forming step, as illustrated in C of FIG. 11, dry etching is performed, for example, on the photoresist 152 opened at the step at step S32, thereby opening the insulating film 126, the antireflection film 125, and the first fixed charge film 123A, and further forming the groove portion 121A on the semiconductor substrate 121 formed of silicon (Si).

Meanwhile, a depth of the groove is set to depth and width required for inhibiting cross-talk. Also, at the silicon groove forming step, the first fixed charge film 123A, an upper layer film thereof, and silicon (Si) may be separately opened. When the step at step S33 is finished, a cleaning step is performed, and thereafter, a step at step S34 is performed.

A second fixed charge film forming step is performed at step S34. At the second fixed charge film forming step, as illustrated in D of FIG. 11, the second fixed charge film 123B is formed by chemical vapor deposition (CVD) on the inner wall surface of the groove portion 121A formed at the step at step S33 and an upper surface of the insulating film 126 formed on the planar portion 121B of the semiconductor substrate 121.

Meanwhile, herein, the groove portion 121A formed at the step at step S33 is significantly damaged by the dry etching, so that a film with stronger pinning such as the aluminum oxide (Al$_2$O$_3$) film, for example, is used as the second fixed charge film 123B covering the inner wall surface thereof.

At step S35, an insulating film forming step is performed. At the insulating film forming step, as illustrated in E of FIG. 11, the insulating film 124 is formed on the second fixed charge film 123B formed at the step at step S34 by atomic layer deposition.

At step S36, a light shielding film forming step is performed. At the light shielding film forming step, as illustrated in F of FIG. 11, the light shielding film 142 is formed on the insulating film 124 formed at the step at step S35.

At step S37, a film processing step is performed. At the film processing step, as illustrated in G of FIG. 11, a part of the second fixed charge film 123B formed at the step at step S34, the insulating film 124 formed at the step at step S35, and the light shielding film 142 formed at the step at step S36 is removed by etching such that only a portion of a predetermined region corresponding to the groove portion 121A is left.

The second manufacturing step is heretofore described.

Meanwhile, although the case in which the third element separating unit 127-3 in FIG. 7 is formed is described at the above-described second manufacturing step, the fourth element separating unit 127-4 in FIG. 8 and the fifth element separating unit 127-5 in FIG. 9 may also be similarly formed. That is to say, when the fourth element separating unit 127-4 is formed, for example, the groove portion 121A covered with the second fixed charge film 123B may be buried (blocked) only with the insulating film 124 at the insulating film forming step at step S35 in FIG. 10.

Also, when the fifth element separating unit 127-5 is formed, for example, etching may be performed such that a part of the second fixed charge film 123B and the insulating film 124 is left on the planar portion 121B of the semiconductor substrate 121 at the film processing step at step S37 in FIG. 10.

In this manner, the light shielding film 142 finally separating the unit pixels 31 is processed on the planar portion 121B of the semiconductor substrate 121 to realize interpixel light shielding; the second fixed charge film 123B is further located below the insulating film 124 serving as bedding after the light shielding film 142 is processed. The second fixed charge film 123B may be left as-is; however, if sensitivity might be deteriorated due to difference in reflective index from the insulating film 124, this may be removed at the time of film processing step for realizing the interpixel light shielding by the light shielding film 142 (S37 in FIG. 10).

3. Variation (Detailed Structure of Element Separating Unit)

Although detailed structures of third to fifth element separating units 127-3 to 127-5 are described in the above-described second embodiment, detailed structures of sixth, seventh, and eighth element separating units 127-6, 127-7, and 127-8 are herein described as further variations of the second embodiment.

(Cross-Sectional Structure of Sixth Element Separating Unit)

Figure 12:
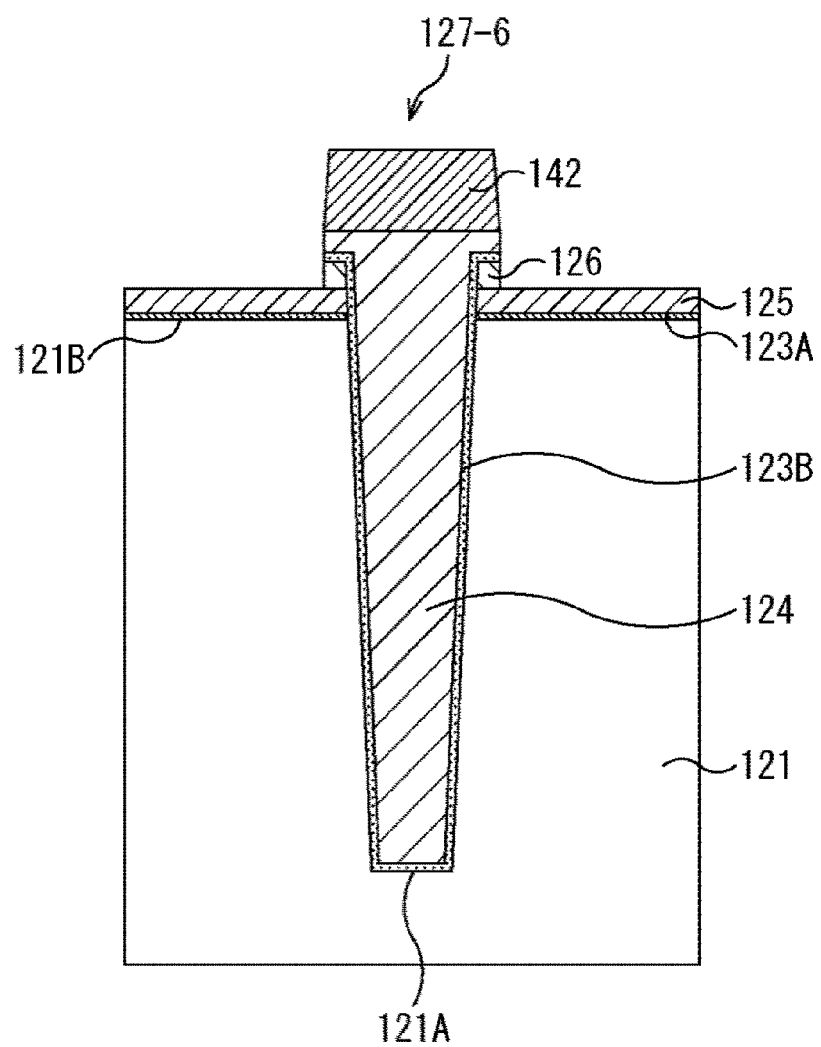
FIG. 12 is a view illustrating a cross-sectional structure of a periphery of a sixth element separating unit.

FIG. 12 is a view illustrating a cross-sectional structure of a periphery of the sixth element separating unit 127-6.

In FIG. 12, as compared to the fourth element separating unit 127-4 in FIG. 8, the sixth element separating unit 127-6 is such that an insulating film 126 formed on a first fixed charge film 123A and an antireflection film 125 is removed by etching with only a portion of a predetermined region corresponding to a second fixed charge film 123B, an insulating film 124, and a light shielding film 142 left on a planar portion 121B of a semiconductor substrate 121.

Also, in FIG. 12, in a groove portion 121A formed on the semiconductor substrate 121, as is the case with the fourth element separating unit 127-4 in FIG. 8, only the insulating film 124 is buried in an inner wall surface covered with the second fixed charge film 123B and the light shielding film 142 is further formed on the insulating film 124.

In the semiconductor substrate 121 on which the sixth element separating unit 127-6 having the above-described structure is formed, blister occurring on the planar portion 121B is inhibited by the first fixed charge film 123A formed of a hafnium oxide ($HfO_2$) film and the like, for example, and in contrast, pinning of the groove portion 121A is strengthened by the second fixed charge film 123B formed of an aluminum oxide ($Al_2O_3$) film and the like, for example. As a result, it is possible to satisfy both inhibition of the dark current and inhibition of the peeling of the fixed charge film in the solid-state imaging device 10.

(Cross-Sectional Structure of Seventh and Eighth Element Separating Units)

Figure 13:
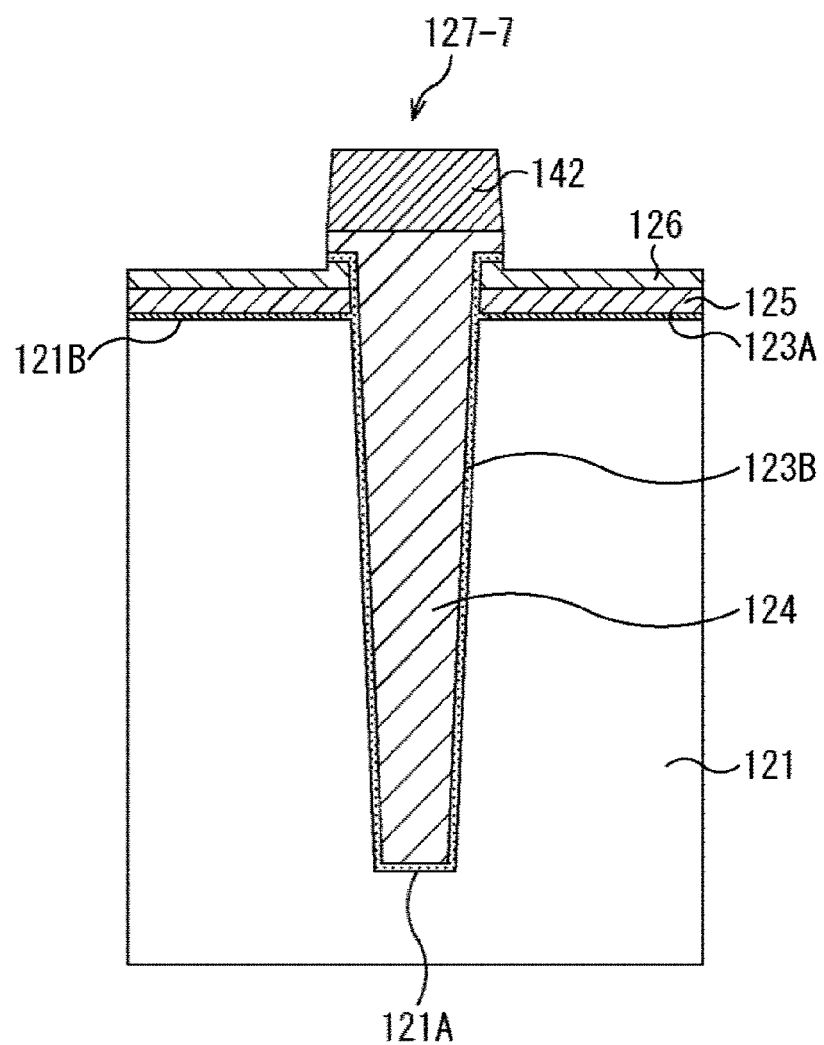
FIG. 13 is a view illustrating a cross-sectional structure of a periphery of a seventh element separating unit.

FIG. 13 is a view illustrating a cross-sectional structure of a periphery of the seventh element separating unit 127-7. Also, FIG. 14 is a view illustrating a cross-sectional structure of a periphery of the eighth element separating unit 127-8.

In FIG. 13, as compared to the fourth element separating unit 127-4 in FIG. 8, the seventh element separating unit 127-7 is such that a large part of a surface of the planar portion 121B of the semiconductor substrate 121 is covered with the first fixed charge film 123A, but a part on a side near the groove portion 121A is covered with the second fixed charge film 123B as is the case with the inner wall surface of the groove portion 121A.

Figure 14:
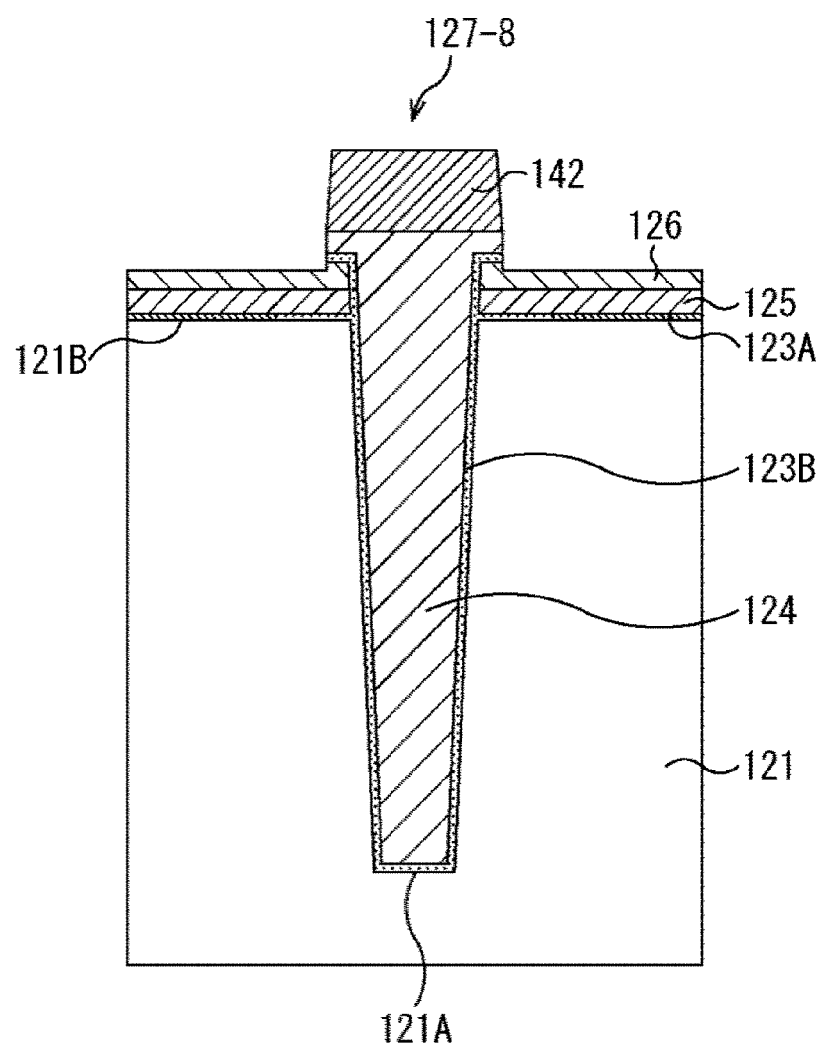
FIG. 14 is a view illustrating a cross-sectional structure of a periphery of an eighth element separating unit.

Meanwhile, although it is required to cover the large part of the surface of the planar portion 121B of the semiconductor substrate 121 with the first fixed charge film 123A in order to inhibit occurrence of the blister, it is also possible to enlarge a portion covered with the second fixed charge film 123B on the surface of the planar portion 121B as illustrated in FIG. 14 as long as the occurrence of the blister may be inhibited.

Also, in FIG. 13, in the groove portion 121A formed on the semiconductor substrate 121, as is the case with the fourth element separating unit 127-4 in FIG. 8, only the insulating film 124 is buried in the inner wall surface covered with the second fixed charge film 123B and the light shielding film 142 is further formed on the insulating film 124.

In the semiconductor substrate 121 on which the seventh or eighth element separating unit 127-7 or 127-8 having the above-described structure is formed, the blister occurring on the planar portion 121B is inhibited by the first fixed charge film 123A formed of the hafnium oxide ($HfO_2$) film and the like, for example, and in contrast, the pinning of the groove portion 121A is strengthened by the second fixed charge film 123B formed of the aluminum oxide ($Al_2O_3$) film and the like, for example. As a result, it is possible to satisfy both inhibition of the dark current and inhibition of the peeling of the fixed charge film in the solid-state imaging device 10.

4. Configuration of Electronic Device

The present technology is not necessarily applied to a solid-state imaging device. That is to say, the present technology is applicable to electronic devices including the solid-state imaging device in general such as a camera module including an optical lens system and the like in addition to the solid-state imaging device, an imaging device such as a digital still camera and a video camera, a portable terminal device having an imaging function (for example, a smartphone and a tablet terminal), or a copying machine in which the solid-state imaging device is used in an image reading unit.

Figure 15:
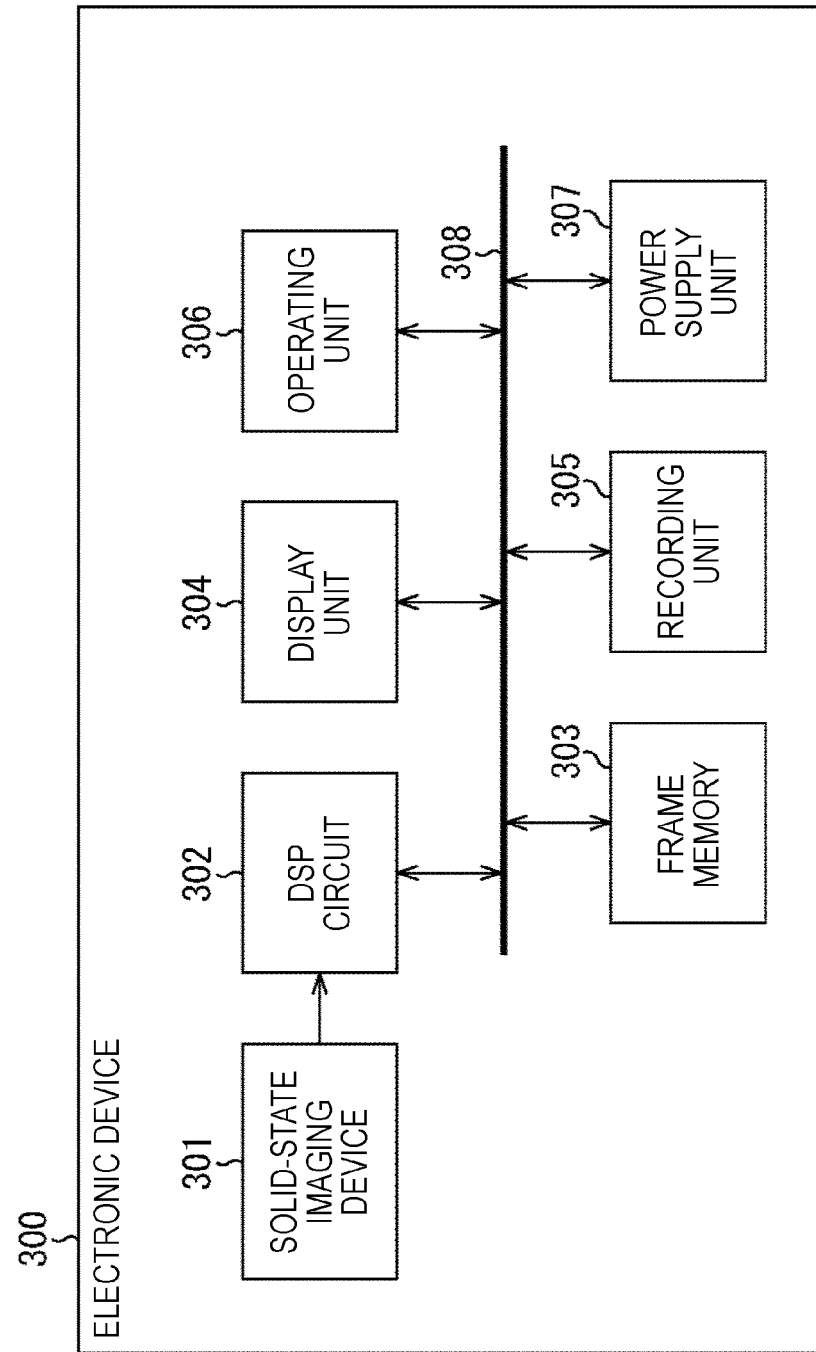
FIG. 15 is a view illustrating a configuration example of an electronic device including a solid-state imaging device.

FIG. 15 is a block diagram illustrating a configuration example of the electronic device including the solid-state imaging device.

An electronic device 300 in FIG. 15 is the electronic device such as the imaging device such as the digital still camera and the video camera, the portable terminal device such as the smartphone and the tablet terminal and the like, for example.

In FIG. 15, the electronic device 300 is formed of a solid-state imaging device 301, a DSP circuit 302, a frame memory 303, a display unit 304, a recording unit 305, an operating unit 306, and a power supply unit 307. Also, in the electronic device 300, the DSP circuit 302, the frame memory 303, the display unit 304, the recording unit 305, the operating unit 306, and the power supply unit 307 are connected to one another via a bus line 308.

The solid-state imaging device 301 captures incident light (image light) from an object through an optical lens system (not illustrated) and converts an amount of the incident light an image of which is formed on an imaging surface to an electric signal in a pixel unit to output as a pixel signal.

Also, the solid-state imaging device 301 corresponds to a solid-state imaging device 10 in FIG. 1 and a cross-sectional structure in FIG. 2 is adopted, for example, as a structure thereof. That is to say, in the solid-state imaging device 301, a surface of a planar portion 121B of a semiconductor substrate 121 is covered with a first fixed charge film 123A such as a hafnium oxide ($HfO_2$) film, for example, and an inner wall surface of a groove portion 121A formed on the semiconductor substrate 121 is covered with a second fixed charge film such as an aluminum oxide ($Al_2O_3$) film, for example.

The DSP circuit 302 is a camera signal processing circuit which processes the signal supplied from the solid-state imaging device 301. The frame memory 303 temporarily holds image data processed by the DSP circuit 302 in a frame unit.

The display unit 304 formed of a panel display device such as a liquid crystal panel and an organic electro luminescence (EL) panel, for example, displays a moving image or a still image taken by the solid-state imaging device 301. The recording unit 305 records image data of the moving image or the still image taken by the solid-state imaging device 301 in a recording medium such as a semiconductor memory and a hard disk.

The operating unit 306 issues an operation order regarding various functions of the electronic device 300 in accordance with operation by a user. The power supply unit 307 appropriately supplies various power sources serving as operation power sources of the DSP circuit 302, the frame memory 303, the display unit 304, the recording unit 305, and the operating unit 306 to supply targets.

The electronic device 300 is formed in the above-described manner. In the solid-state imaging device 301 of the electronic device 300, a negative fixed charge film covering the surface of the planar portion 121B of the semiconductor substrate 121 and the negative fixed charge film covering the inner wall surface of the groove portion 121A formed on the semiconductor substrate 121 which are different from each other are used according to an amount of damage received from dry etching for forming the groove portion 121A, so that it is possible to inhibit peeling of the fixed charge film while inhibiting dark current.

5. Usage Example of Solid-State Imaging Device

Figure 16:
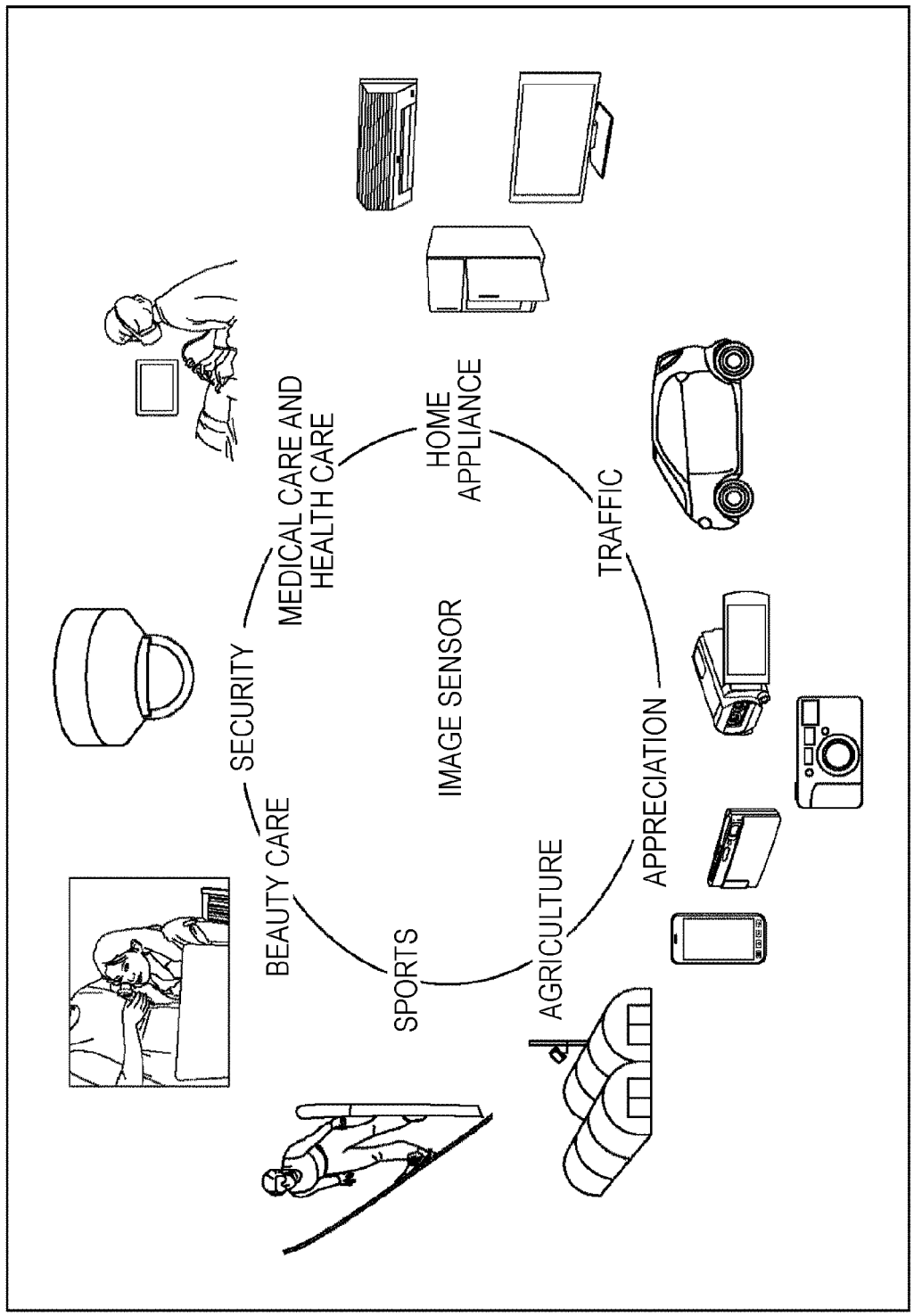
FIG. 16 is a view illustrating a usage example of a solid-state imaging device.

FIG. 16 is a view illustrating a usage example of a solid-state imaging device 10 as an image sensor.

The above-described solid-state imaging device 10 may be used in various cases in which light such as visible light, infrared light, ultraviolet light, and X-ray is sensed as described below, for example. That is to say, as illustrated in FIG. 16, the solid-state imaging device 10 may be used in devices used in a traffic field, a home appliance field, a medical care and health care field, a security field, a beauty care field, a sports field, or an agricultural field, for example, in addition to a field of appreciation in which an image to be appreciated is taken described above.

Specifically, as described above, the solid-state imaging device 10 may be used in a device for taking an image to be appreciated (electronic device 300 in FIG. 15, for example) such as a digital camera, a smartphone, and a cell phone having a camera function, for example, in the field of appreciation.

In the traffic field, the solid-state imaging device 10 may be used in devices used for traffic such as a vehicle-mounted sensor which takes images of the front, back, surroundings, and inside of an automobile, a monitoring camera which monitors running vehicles and roads, and a ranging sensor which measures a distance between vehicles for safe driving such as automatic stop and recognition of a driver's condition, for example.

In the home appliance field, the solid-state imaging device 10 may be used in home appliances such as a television receiver, a refrigerator, and an air conditioner for taking an image of a user's gesture and operating the device according to the gesture, for example. Also, in the medical care and health care field, the solid-state imaging device 10 may be used in medical care and health care devices such as an endoscope and a device performing angiography by receiving infrared light, for example.

In the security field, the solid-state imaging device 10 may be used in security devices such as a security monitoring camera and a personal authentication camera, for example. Also, in the beauty care field, the solid-state imaging device 10 may be used in beauty care devices such as a skin measuring device which takes an image of skin and a microscope which takes an image of head skin, for example.

In the sports field, the solid-state imaging device 10 may be used in sports devices such as an action camera and a wearable camera for sports, for example. Also, in the agricultural field, the solid-state imaging device 10 may be used in agricultural devices such as a camera for monitoring a land and crop state, for example.

Meanwhile, the embodiments of the present technology are not limited to the above-described embodiments and various modifications may be made without departing from the scope of the present technology. For example, it is possible to adopt a mode obtained by combining all or some of a plurality of embodiments described above.

The present technology may also have the following configurations.

(1)

A solid-state imaging device including:

a semiconductor substrate in which a plurality of photoelectric conversion elements is formed;

a groove portion formed in a depth direction from a light incident side for forming an element separating unit between adjacent photoelectric conversion elements on the semiconductor substrate;

a first fixed charge film formed to cover a surface of a planar portion on the light incident side of the semiconductor substrate; and a second fixed charge film formed to cover an inner wall surface of the groove portion formed on the semiconductor substrate.

(2)

The solid-state imaging device according to (1), wherein
the first fixed charge film is a first negative fixed charge film, and
the second fixed charge film is a second negative fixed charge film different from the first negative fixed charge film.

(3)

The solid-state imaging device according to (2), wherein
a large part of an inner peripheral surface is covered with the second negative fixed charge film and a remaining part of the inner peripheral surface is covered with the first negative fixed charge film on the inner wall surface of the groove portion formed on the semiconductor substrate.

(4)

The solid-state imaging device according to (2), wherein
a large part of the surface of the planar portion is covered with the first negative fixed charge film and a remaining part of the surface of the planar portion is covered with the second negative fixed charge film on the planar portion on the light incident side of the semiconductor substrate.

(5)

The solid-state imaging device according to any one of (2) to (4), wherein
the first negative fixed charge film is the negative fixed charge film according to an amount of damage received by the planar portion from etching for forming the groove portion on the semiconductor substrate, and
the second negative fixed charge film is the negative fixed charge film according to an amount of damage received by the inner wall surface of the groove portion from the etching.

(6)

The solid-state imaging device according to any one of (1) to (5), wherein
a light shielding film is formed on the groove portion formed on the semiconductor substrate.

(7)

The solid-state imaging device according to (6), wherein
the light shielding film is formed of aluminum (Al) or tungsten (W).

(8)

The solid-state imaging device according to any one of (1) to (7), wherein
the solid-state imaging device is a backside illumination complementary metal oxide semiconductor (CMOS) image sensor,
a light condensing layer is formed on a back surface side of the semiconductor substrate, and
a wiring layer is formed on a front surface side of the semiconductor substrate.

(9)

A manufacturing method including steps of:
forming a groove portion in a depth direction from a light incident side by etching for forming an element separating unit between adjacent photoelectric conversion elements on a semiconductor substrate in which a plurality of photoelectric conversion elements is formed;
forming a second fixed charge film according to an amount of damage received by an inner wall surface of the groove portion from the etching so as to cover the inner wall surface of the groove portion formed on the semiconductor substrate; and
forming a first fixed charge film according to an amount of damage received by a planar portion from the etching so as to cover a surface of the planar portion on the light incident side of the semiconductor substrate.

(10)

A manufacturing method including steps of:
forming a first fixed charge film according to an amount of damage received by a planar portion from etching for forming a groove portion on a semiconductor substrate so as to cover a surface of the planar portion on a light incident side of the semiconductor substrate in which a plurality of photoelectric conversion elements is formed;
forming the groove portion in a depth direction from the light incident side by the etching for forming an element separating unit between adjacent photoelectric conversion elements on the semiconductor substrate covered with the first fixed charge film; and
forming a second fixed charge film according to an amount of damage received by an inner wall surface of the groove portion from the etching so as to cover the inner wall surface of the groove portion formed on the semiconductor substrate.

(11)

An electronic device including:
a solid-state imaging device including:
a semiconductor substrate in which a plurality of photoelectric conversion elements is formed;
a groove portion formed in a depth direction from a light incident side for forming an element separating unit between adjacent photoelectric conversion elements on the semiconductor substrate;
a first fixed charge film formed so as to cover a surface of a planar portion on the light incident side of the semiconductor substrate; and
a second fixed charge film formed so as to cover an inner wall surface of the groove portion formed on the semiconductor substrate.

REFERENCE SIGNS LIST

10 Solid-state imaging device
21 Pixel array unit
31 Unit pixel
110 Supporting substrate
120 Light receiving layer
121 Semiconductor substrate
121A Groove portion
121B Planar portion
122 Photodiode
123A First fixed charge film
123B Second fixed charge film
124 Insulating film
125 Antireflection film
126 Insulating film
127 Element separating unit
130 Wiring layer
131 Interlayer insulating film
132 Wiring
140 Light condensing layer
141 On-chip lens
142 Light shielding film
143 Planarizing film
144 Color filter film
300 Electronic device
301 Solid-state imaging device

The invention claimed is:

1. A light detecting device comprising:
a first photoelectric conversion region and a second photoelectric conversion region disposed in a semiconductor substrate, wherein the first photoelectric conversion region is adjacent to the second photoelectric conversion region;

a groove portion disposed in the semiconductor substrate below a light receiving plane of the semiconductor substrate in a cross-sectional view, wherein the groove portion is disposed between the first photoelectric conversion region and the second photoelectric conversion region;

a first film disposed above the light receiving plane, wherein the first film includes a hafnium oxide, and wherein an opening of the groove portion is blocked by the first film in the cross-sectional view; and a second film covering an inner wall surface of the groove portion, wherein the second film includes one of an aluminum oxide, zirconium oxide, tantalum oxide, or titanium oxide.

2. The light detecting device of claim 1, wherein the opening of the groove portion is disposed below the light receiving plane.

3. The light detecting device of claim 1, wherein the opening of the groove portion is higher than the first photoelectric conversion region and the second photoelectric conversion region in the cross-sectional view.

4. The light detecting device of claim 1, wherein the first film is a first fixed charge film.

5. The light detecting device of claim 4, wherein a large portion of the light receiving plane is covered by the first fixed charge film.

6. The light detecting device of claim 1, wherein the second film is a second fixed charge film.

7. The light detecting device of claim 6, wherein a large portion of the inner wall surface is covered by the second fixed charge film.

8. The light detecting device of claim 1, wherein a light shielding portion is disposed above the groove portion.

9. The light detecting device of claim 8, wherein the light shielding portion includes one of W or Al.

10. The light detecting device of claim 1, wherein the light receiving plane is opposite to a side of a wiring layer.

11. The light detecting device of claim 1, wherein the light detecting device comprises a backside illumination Complementary Metal Oxide Semiconductor (CMOS) image sensor.

12. A light detecting device comprising:
a first photoelectric conversion region and a second photoelectric conversion region disposed in a semiconductor substrate, wherein the first photoelectric conversion region is adjacent to the second photoelectric conversion region;

a groove portion disposed in the semiconductor substrate below a light receiving plane of the semiconductor substrate in a cross-sectional view, and wherein the groove portion is disposed between the first photoelectric conversion region and the second photoelectric conversion region in the cross-sectional view;

a first film disposed above the light receiving plane, wherein the first film includes a hafnium oxide, wherein an opening of the groove portion is blocked by the first film in the cross-sectional view, and wherein the first film comprises a first portion, a second portion, and a third portion, and wherein the second portion is disposed between the first portion and the third portion; and a second film covering an inner wall surface of the groove portion, wherein the second film includes one of an aluminum oxide, zirconium oxide, tantalum oxide, or titanium oxide.

13. The light detecting device of claim 12, wherein the first portion and the third portion of the first film are disposed above the first photoelectric conversion region and the second photoelectric conversion region, respectively, in the cross-sectional view.

14. The light detecting device of claim 12, wherein the second portion of the first film is disposed above the groove portion in the cross-sectional view.

15. The light detecting device of claim 12, wherein the second portion of the first film is in direct contact with the second film.

16. The light detecting device of claim 12, wherein the first portion, the second portion, and the third portion of the first film are linked together.

17. An electronic device comprising:
a light detecting device including:
a semiconductor substrate;
a first photoelectric conversion region and a second photoelectric conversion region disposed in the semiconductor substrate, wherein the first photoelectric conversion region is adjacent to the second photoelectric conversion region;
a groove portion disposed in the semiconductor substrate below a light receiving plane of the semiconductor substrate in a cross-sectional view, and disposed between the first photoelectric conversion region and the second photoelectric conversion region in the cross-sectional view;
a first film disposed above the light receiving plane, wherein the first film includes a hafnium oxide, and wherein an opening of the groove portion is blocked by the first film in the cross-sectional view; and
a second film covering an inner wall surface of the groove portion, wherein the second film includes one of an aluminum oxide, zirconium oxide, tantalum oxide, or titanium oxide.

* * * * *